US012716947B2

(12) United States Patent
Liu et al.

(10) Patent No.: US 12,716,947 B2
(45) Date of Patent: Aug. 25, 2026

(54) LEBESGUE-SAMPLING-BASED LI-BATTERY WHOLE-SERVICE-LIFE SOC ESTIMATION USING SIMPLIFIED FIRST PRINCIPLE (SFP) MODEL

(71) Applicant: University of South Carolina, Columbia, SC (US)

(72) Inventors: Enhui Liu, Columbia, SC (US); Bin Zhang, Irmo, SC (US)

(73) Assignee: University of South Carolina, Columbia, SC (US)

(*) Notice: Subject to any disclaimer, the term of this patent is extended or adjusted under 35 U.S.C. 154(b) by 402 days.

(21) Appl. No.: 18/259,322

(22) PCT Filed: Dec. 29, 2021

(86) PCT No.: PCT/US2021/065454
§ 371 (c)(1),
(2) Date: Jun. 26, 2023

(87) PCT Pub. No.: WO2022/147080
PCT Pub. Date: Jul. 7, 2022

(65) Prior Publication Data

US 2024/0069105 A1 Feb. 29, 2024

Related U.S. Application Data

(60) Provisional application No. 63/131,369, filed on Dec. 29, 2020.

(51) Int. Cl.
*G01R 31/367* (2019.01)
*G01R 31/382* (2019.01)
*G01R 31/392* (2019.01)

(52) U.S. Cl.
CPC ......... *G01R 31/367* (2019.01); *G01R 31/382* (2019.01); *G01R 31/392* (2019.01)

(58) Field of Classification Search
CPC ... G01R 31/367; G01R 31/382; G01R 31/392
See application file for complete search history.

(56) References Cited

U.S. PATENT DOCUMENTS

| | | | | |
|---|---|---|---|---|
| 11,069,926 | B1 * | 7/2021 | Kohn | B60L 58/10 |
| 11,407,327 | B1 * | 8/2022 | Kohn | B60L 50/40 |
| 2017/0271984 | A1 * | 9/2017 | Kohn | H02J 7/855 |

OTHER PUBLICATIONS

Yan et al., "Uncertainty Management in Lebesgue-Sampling-Based Diagnosis and Prognosis for Lithium-Ion Battery," Oct. 2017, IEEE Transactions on Industrial Electronics, vol. 64, No. 10, pp. 8158-8166. (Year: 2017).*

Mejdoubi et al., "Lithium-Ion Batteries Health Prognosis Considering Aging Conditions," Jul. 2019, IEEE Transactions on Power Electronics, vol. 34, No. 7, pp. 6834-6844. (Year: 2019).*

(Continued)

*Primary Examiner* — Ricky Go
(74) *Attorney, Agent, or Firm* — Douglas L. Lineberry

(57) ABSTRACT

Described herein is a high fidelity SFP Li-battery model, which can describe the internal electrochemical reaction mechanism accurately, to estimate State of Health (SOH) and State of Charge (SOC) of Li-batteries.

14 Claims, 17 Drawing Sheets

(56) References Cited

OTHER PUBLICATIONS

Yan, Wuzhao, et al., A Battery Management System With a Lebesgue-Sampling-Based Extended Kalman Filter, IEEE Transactions on Industrial Electronics, Apr. 1, 2019, pp. 3227-3236, vol. 66, No. 4, Piscataway, NJ, USA.
Yan, Wuzhao, et al., State-of-Charge Estimation of Lithium-ion Batteries by Lebesgue Sampling-Based EKF Method, IECON 2017—43rd Annual Conf. of IEEE Ind. Elect. Soc., IEEE, Oct. 29, 2017, pp. 3233-3238.
Yan, Wuzhao, et al., Lebesgue-Sampling-Based Diagnosis and Prognosis for Lithium-Ion Batteries, IEEE Transactions on Industrial Electronics, IEEE Service Center, Mar. 1, 2016, pp. 1804-1812, vol. 63, No. 3, Piscataway, NJ, USA.
Yan, Wuzhao, et al., Parameters Adaption of Lebesgue Sampling-based Diagnosis and Prognosis for Li-ion Batteries, Annual Conf. of the Prognosics and Health Management Society 2015, Jan. 1, 2015, XP055909436.
Acuna, David, et al., Theoretical Advances in Lebesgue-sampling-based Prognostic Algorithms, 2019 Prognostics and System Health Management Conf. PHM-Paris, IEEE, May 2, 2019, pp. 7-12, Paris, France.

* cited by examiner

TABLE I: Battery specifications

| Specifications | Value |
| --- | --- |
| Height | 50.0 + 0.2 mm |
| Diameter | 14.0 + 0.2 mm |
| Weight | Approx.: 50 g |
| Rated capacity | 840 mA h |
| Cutoff voltage of charging | 4.2 V |
| Positive material | $LiCoO_2$ |
| Negative material | Graphite |

FIG. 6

TABLE II: Parameter range for LiCoO2 battery

| Model parameter | Parameter range |
| --- | --- |
| $x_0(-)$ | $[0.7047,\ 0.8613]$ |
| $y_0(-)$ | $[0.3995,\ 0.4883]$ |
| $Q_n(\mathrm{C})$ | $[3.1726,\ 3.8776] \times 10^3$ |
| $Q_p(\mathrm{C})$ | $[5.1386,\ 6.2805] \times 10^3$ |
| $\tau_{\mathrm{sn}}(\mathrm{s})$ | $[158.46,\ 193.68]$ |
| $\tau_{\mathrm{sp}}(\mathrm{s})$ | $[103.85,\ 126.93]$ |
| $\tau_{\mathrm{e}}(\mathrm{s})$ | $[53.88,\ 65.86]$ |
| $P_{\mathrm{con}}\ (\mathrm{molm}^{-3}\ \mathrm{A}^{-1})$ | $[864.23,\ 1056.28]$ |
| $P_{\mathrm{actn}}\ (\mathrm{m}^{-1.5}\ \mathrm{mol}^{0.5}\ \mathrm{s})$ | $[5.2623,\ 6.7854] \times 10^5$ |
| $P_{\mathrm{actp}}\ (\mathrm{m}^{-1.5}\ \mathrm{mol}^{0.5}\ \mathrm{s})$ | $[6.4682,\ 7.9056] \times 10^5$ |
| $R_{\mathrm{ohm}}\ (\Omega)$ | $[0.0609,\ 0.0745]$ |

FIG. 7

TABLE III: Comparisons at different current profiles

| Current profiles | AAE (mV) | MAE (mV) |
| --- | --- | --- |
| Discharging / 0.5-C | 16.5 | 28.4 |
| Discharging / 1-C | 25.6 | 70.5 |
| Discharging / 2-C | 41.3 | 150.3 |
| Charging / 0.5-C | 23.1 | 59.5 |
| Charging / 1-C | 27.7 | 62.5 |
| DST | 28.6 | 74.0 |

FIG. 9

TABLE IV: Comparison of LS-EKF and RS-EKF

| rate | 1-C | | 2-C | | DST | |
|---|---|---|---|---|---|---|
| | LS-EKF | RS-EKF | LS-EKF | RS-EKF | LS-EKF | RS-EKF |
| $\mu_{soc}$ | 0.730 | 0.719 | 0.465 | 0.461 | 0.951 | 0.945 |
| $CI_{soc}$ | [0.722 0.738] | [0.713 0.724] | [0.461 0.474] | [0.455 0.465] | [0.950 0.953] | [0.944 0.946] |
| EN | 54 | 1000 | 107 | 1000 | 12 | 1000 |
| AAE | 2.03% | 1.98% | 2.96% | 2.89% | 2.51% | 2.53% |
| $RDT_T$ | 3273 | 3273 | 1607 | 1607 | 21500 | 21500 |
| $\mu_{RDT}$ | 3526 | 3699 | 1766 | 1843 | 23704 | 25282 |
| $CI_{RDT}$ | [3516 3534] | [3589 3809] | [1763 1769] | [1811 1875] | [23632 22830] | [23143 27405] |
| PH | 135 | 2699 | 83 | 843 | 180 | 24282 |
| PT (s) | 0.0254 | 0.508 | 0.0156 | 0.158 | 0.034 | 4.57 |

FIG. 16

LEBESGUE-SAMPLING-BASED LI-BATTERY WHOLE-SERVICE-LIFE SOC ESTIMATION USING SIMPLIFIED FIRST PRINCIPLE (SFP) MODEL

TECHNICAL FIELD

The subject matter disclosed herein is generally directed to a high fidelity SFP Li-battery model, which can describe the internal electrochemical reaction mechanism accurately, to estimate State of Health (SOH) and State of Charge (SOC) of Li-batteries.

BACKGROUND

The battery is a critical component of industrial systems, electric cars, and aerospace areas. Hundreds of companies around the world are conducting related works on the Li-battery. The Li-battery has a bright future, and will change our world due to its high energy density, voltage capacity, and lower self-discharge rate than other rechargeable batteries.

Traditional SOH and SOC estimations are mainly based on the electrochemical model or equivalent circuit model of a Li-battery. The electrochemical model can describe the internal electrochemical reaction mechanism of a Li-battery accurately, but the computation is high, which hinders embedded applications. On the contrary, computation of the equivalent circuit model is low, but it cannot simulate the behavior of Li-battery accurately.

In recent years, Li-ion batteries attracted more and more attentions for the advantages of high power and energy density, low self-discharge rate, long lifetime, and no memory effect. See C. Lyu, Y. Song, L. Wang, J. Li, B. Zhang, and E. Liu. A new method for lithium-ion battery uniformity sorting based on internal criteria. *Journal of Energy Storage,* 25:100885, 2019 and J. Li, L. Wang, C. Lyu, E. Liu, J. Xing, and M. Pecht. A parameter estimation method for a simplified electrochemical model for li-ion batteries. *Electrochimica Acta,* 275, 04 2018. LIB s have been widely used in electric vehicles, autonomous mobile robots, consumer electronics, smart microgrids, and many others. See, Z. Chen, H. Sun, G. Dong, J. Wei, and J. Wu. Particle filter-based state-of-charge estimation and remaining-dischargeable-time prediction method for lithium-ion batteries. *Journal of Power Sources,* 414:158-166, 2019. Abnormal working conditions of batteries may cause severe consequences, even casualties to target systems. For example, overcharge and overdischarge may cause overheating, which shortens the battery lifespan and induces potential safety problems. It is crucial to develop reliable, safe, and cost-efficient methods to monitor the condition and predict the future work status of batteries.

State-of-charge (SOC) is an essential indicator for battery management, which generally represents the available charge stored in the battery compared to the full charge capacity of the battery. It is often defined as the ratio between the remaining usable charge to the total charge. See Z. Chen et al. Battery SOC is an internal state, which cannot be measured directly and can only be estimated. Many methods have been presented to improve SOC estimation performance. The most commonly used methods fall into three categories: Coulomb counting method, data-driven method, and lumped parameter model based method. See, J. Guo, Z. Li, and M. Pecht. A Bayesian approach for li-ion battery capacity fade modeling and cycles to failure prognostics. *Journal of Power Sources,* 281:173-184, 2015. The Coulomb counting method is simple and easy to implement but its estimation accuracy decreases over time due to the accumulated error in current measurement and changes of battery internal dynamics. See, H. Wenzl. Batteries and fuel cells—efficiency. In Jurgen Garche, editor, *Encyclopedia of Electrochemical Power Sources*, pages 544-551. Elsevier, Amsterdam, 2009 and R. Xiong, F. Sun, X. Gong, and C. Gao. A data-driven based adaptive state of charge estimator of lithium-ion polymer battery used in electric vehicles. *Applied Energy,* 113:1421-1433, 2014. Besides, the full capacity needs to be updated periodically to avoid the initial integral deviation of SOC estimation. See, F. Sun, X. Hu, Zou, and S. Li. Adaptive unscented Kalman filtering for state of charge estimation of a lithium-ion battery for electric vehicles. *Energy,* 36(5):3531-3540, 2011. An alternative approach is open-circuit voltage (OCV)-based approach. This approach, however, needs accurate measurement of voltage and periodic rest and updating of the full capacity, which induces high cost and make accurate SOC estimation difficult in real applications. See, J. Li, L. Wang, C. Lyu, and M. Pecht. State of charge estimation based on a simplified electrochemical model for a single $LiCoO_2$ battery and battery pack. *Energy,* 133:572-583, 2017. The data-driven approaches, on the other hand, require a large quantity of high-quality data. These methods rely on machine learning methods, such as artificial neural networks. See, X. Liu, J. Wu, C. Zhang, and Z. Chen. A method for state of energy estimation of lithium-ion batteries at dynamic currents and temperatures. *Journal of Power Sources,* 270:151-157, 2014, and support vector regression, Y. Chen, P. Xu, Y. Chu, W. Li, Y. Wu, L. Ni, Y. Bao, and K. Wang. Short-term electrical load forecasting using the support vector regression model to calculate the demand response baseline for office buildings. *Applied Energy,* 195:659-670, 2017 and D. How, M. Hannan, M. Hossain Lipu, and P. Ker. State of charge estimation for lithium-ion batteries using model-based and data-driven methods: A review. *IEEE Access,* 7:136116-136136, 2019, to train a model to fit the non-linear relationship between the observed data and SOC. These methods have achieved promising results in battery SOC estimation and prediction. For instance, long short-term memory networks show better accuracy and faster convergence speed of SOC estimation, F. Yang, X. Song, F. Xu, and K. L. Tsui. State-of-charge estimation of lithium-ion batteries via long short-term memory network. *IEEE Access,* 7:53792-53799, 2019, with only external battery measurements (e.g., load current, terminal voltage) and E. Chemali, P. Kollmeyer, M. Preindl, R. Ahmed, and A. Emadi. Long short-term memory networks for accurate state-of-charge estimation of Li-ion batteries. *IEEE Transactions on Industrial Electronics,* 65(8):6730-6739, 2018. The quantity and quality of training data and the fitting capability of data-driven methods have a great impact on the performance. The battery model trained from unbalanced data cannot describe the battery behavior accurately and will result in overfitting and underfitting. See, Pedro Domingos. A few useful things to know about machine learning. *Commun. ACM,* 55(10): 78-87, October 2012.

The model-based methods mainly include the equivalent circuit model (ECM), see, M. Tran, A. Mevawala, S. Panchal, K. Raahemifar, M. Fowler, and R. Fraser. Effect of integrating the hysteresis component to the equivalent circuit model of lithium-ion battery for dynamic and nondynamic applications. *Journal of Energy Storage,* 32:101785, 2020 and L. Zhang, H. Peng, Z. Ning, Z. Mu, and C. Sun. Comparative research on RC equivalent circuit models for lithium-ion batteries of electric vehicles. *Applied Sciences,*

7(10):1002, 2017 and the electrochemical model (EM). See, W. Luo, C. Lyu, L. Wang, and L. Zhang. A new extension of physics based single particle model for higher charge—discharge rates. *Journal of Power Sources,* 241:295-310, 2013 and S. Tang, L. Camacho-Solorio, Y. Wang, and M. Krstic. State-of-charge estimation from a thermal—electrochemical model of lithium-ion batteries. Automatica, 83:206-219, 2017. The ECM indirectly explains the battery internal electrochemical reactions by some circuit parameters, such as resistors, capacitors, and voltage source following a standard parallel resistor-capacitor topology. In the ECM, each parameter corresponds to a particular electrochemical reaction.

However, ECM is an empirical model and cannot describe the electrochemical reaction from a microscopic point of view. The complexity of electrochemical reactions, the nonlinear battery dynamics, and varying operating conditions, make it difficult to obtain reliable ECM circuit parameters. Therefore, ECM often cannot guarantee accurate SOC estimations and remaining-dischargeable-time (RDT) predictions over the entire lifespan of batteries.

On the contrary, EMs, such as pseudo-2D model, see A. M. Bizeray, S. Zhao, S. R. Duncan, and D. A. Howey. Lithiumion battery thermal-electrochemical model-based state estimation using orthogonal collocation and a modified extended Kalman filter. *Journal of Power Sources,* 296:400-412, 2015, and single particle model, see, X. Han, M. Ouyang, L. Lu, and J. Li. Simplification of physics-based electrochemical model for lithium ion battery on electric vehicle. Part i: Diffusion simplification and single particle model. *Journal of Power Sources,* 278:802-813, 2015, describe the processes of conservation of mass, energy balance, and electrochemical reaction kinetics in a microcosmic manner. They have better performance in describing the battery states. However, the single particle model neglects the uneven reaction process and concentration polarization of the battery, which makes it computationally efficient but not very accurate, especially at high current rates. To address this issue, a simplified first principle (SFP) model was developed by supplementing concentration polarization. See, W. Luo et al. and J. Li, L. Wang, C. Lyu, and M. Pecht. State of charge estimation based on a simplified electrochemical model for a single $LiCoO_2$ battery and battery pack. *Energy,* 133:572-583, 2017.

These EM-based methods generally show better performance than ECM-based ones. However, a major limitation is their high computation. Compared to EOMs, EMs are more complicated, have more state variables and more parameters, and need more partial differential equations to describe battery dynamics. More importantly, these methods are designed in the traditional Riemann sampling (RS)-based framework in which EMs and state estimation and prediction algorithms are executed at the sampling rate of battery. This makes it difficult or even impossible to deploy EM-based methods on low cost hardware, such as embedded systems or microcontrollers, for industrial applications.

In most real applications, battery SOC in a discharge cycle decreases nonlinearly mainly because of its physical and electrochemical characteristics and changing operating conditions, see, Z. Chen et al. and R. Guo, L. Lu, M. Ouyang, and X. Feng. Mechanism of the entire over discharge process and over discharge-induced internal short circuit in lithium-ion batteries. *Scientific Reports,* 6(1):1-9, 2016. The characteristics of the terminal voltage show that the battery voltage drops very slowly in the early stage of battery operation but drops very quickly in the late stage of operation. The rapid terminal voltage drop in the late stage of operation indicates that the energy supply ability of battery decreases fast in the low SOC interval (usually 30%-5%). The larger the discharge current, the faster the energy supply ability drops. Therefore, to prevent over-discharging, SOC indicator alone is not enough to ensure safe operation of batteries, see Z. Chen et al. To address this issue, many battery RDT prediction methods were developed. Some reported works include data-driven method for end of discharge time prediction, see, A. Saxena, J. Celaya, I. Roychoudhury, S. Saha, B. Saha, and K. Goebel. Designing data-driven battery prognostic approaches for variable loading profiles: Some lessons learned. In *European Conference of Prognostics and Health Management Society*, pages 72-732, 2012, model-based method, see G. Dong, J. Wei, Z. Chen, H. Sun, and X. Yu. Remaining dischargeable time prediction for lithium-ion batteries using unscented Kalman filter. *Journal of Power Sources,* 364:316-327, 2017, simple electrochemical model-based method, F. Quinones, R. H. Milocco, and S. G. Real. Remaining discharge-time prediction for batteries using the Lambert function. *Journal of Power Sources,* 400:256-263, 2018, and particle-filtering-based method, see D. Pola, H. Navarrete, and M. Orchard et al. Particle-filtering-based discharge time prognosis for lithium-ion batteries with a statistical characterization of use profiles. *IEEE Transactions on Reliability,* 64(2):710-720, 2015. Although these works achieved promising results, all of them, however, cannot guarantee high accuracy of SOC estimation, RDT prediction, and low computational cost simultaneously, especially when the battery has dynamic loading profiles.

Traditionally, these SOC estimation and RDT prediction algorithms are implemented in the RS framework, in which samples are taken in a periodic way and the algorithm is implemented every time when a new measurement becomes available. See, W. Yan, B. Zhang, G. Zhao, S. Tang, G. Niu, and X. Wang. A battery management system with a Lebesgue-sampling-based extended Kalman filter. *IEEE Transactions on Industrial Electronics,* 66(4):3227-3236, 2019. One major limitation of the RS-based algorithm is its high computational cost, especially for EMs that have high computational demand.

Accordingly, it is an object of the present disclosure to overcome the high calculation of the SFP model of Li-batteries. Meanwhile maintaining the SFP model's high fidelity to describe its internal electrochemical reaction mechanism accurately, which enables the realization of embedded online applications.

Citation or identification of any document in this application is not an admission that such a document is available as prior art to the present disclosure.

SUMMARY

The above objectives are accomplished according to the present disclosure by providing a method for estimating battery life. The method may include diagnosing a state of health in at least one battery via a state of health diagnostic algorithm via a computer processor having software stored therein for executing the state of health diagnostic algorithm, establishing at least one predefined Lebesgue state for the state of health and storing same in the computer processor, executing the state of health diagnostic algorithm when a battery measurement state of health for the at least one battery reaches the at least one predefined Lebesgue state, executing a state of health prognostic algorithm to estimate at least one distribution of operating time for the at least one battery at the predefined Lebesgue state, estimating a state of charge for the at least one battery via a state of charge diagnostic algorithm via the computer processor also having software stored therein for executing the charge diagnostic algorithm, executing the state of charge diagnostic algorithm when the battery measurement state of health for the at least one battery reaches the at least one predefined Lebesgue state wherein the state of charge estimation is based on at least one previous predefined Lebesgue state, and executing a state of charge prognostic algorithm to estimate at least one distribution of operating time for each state of charge reaching each Lebesgue state.

Further, the method may include establishing multiple predefined Lebesgue states for the state of health and storing same in the computer processor. Still yet, the at least one previous predefined Lebesgue state is the predefined Lebesgue state occurring immediately prior to the at least one predefined first Lebesgue state that caused executing the state of charge diagnostic algorithm. Moreover, the method may include changing a time of executing the state of charge diagnostic algorithm based on a rate of change from a first predefined Lebesgue state to a second predefined Lebesgue state. Still further, the method may include decreasing executing the state of charge diagnostic algorithm when the rate of change from the first predefined Lebesgue state to the second predefined Lebesgue state increases. Yet again, the method may include executing the state of charge diagnostic algorithm when the rate of change from the first predefined Lebesgue state to the second predefined Lebesgue state decreases. Further still, the method may not execute any prognostic algorithm until the at least one predefined Lebesgue state is reached. Again, the method may be conduct the estimation in real time.

In a further embodiment, a method for providing a state of charge estimation and remaining dischargeable time prediction for batteries is provided. The method may include implementing a Lebesgue Sampling based Extended Kalman Filter (LS-EKF) with respect to at least one battery via a computer processor having software stored therein for executing the Lebesgue sampling based extended Kalman filter, providing an event-triggered execution scheme wherein when a new measurement becomes available via a signal, an event checker determines whether the new measurement has transitioned from one Lebesgue state to another Lebesgue state, executing, via the computer processor, when the new measurement has transitioned from one Lebesgue state stored in the processor to another Lebesgue state stored in the processor, executing a state of charge algorithm to calculate a state of charge estimation, after obtaining the state of charge estimation, executing a remaining dischargeable time prediction algorithm via the computer processor with a Lebesgue time model to predict an operation time distribution for the at least one battery; and displaying the operation time distribution derived from the state of charge estimation on a display.

Further, the method may include determining an open circuit voltage via solid-phase surface concentration of particles at least one positive electrode and at least one negative electrode. Still yet, the method may determine a liquid-phase diffusion effect via determining a concentration difference between the at least one positive electrode and the at least one negative electrode to determine the electrolyte overpotential. Further still, the method may include the processes estimates at least one internal electrochemical reaction comprising open-circuit voltage, solid-phase diffusion, liquid-phase diffusion, reaction polarization, and/or ohmic polarization. Further yet, the method may conduct prediction of the operation time distribution in real time. Even further, implementing the LS-EKF algorithm for state estimation may include:

Step 1: Initialization $$x_{0|0} = E(x_0)$$

$$P_{0|0} = E\{[x_0 - E(x_0)][x_0 - E(x_0)]^T\}$$

where $x_{0|0}$ is an initial value of a SOC state; $E(\cdot)$ is an expectation; $P_{0|0}$ is an initial covariance matrix.

Step 2: an a Priori State Estimation $$x_{t_k|t_{k1}} = f(x_{t_{k1}|t_{k1}}, u_{t_k}, D)$$

Step 3: a Covariance Matrix Calculation $$P_{t_k|t_{k1}} = A_{t_k} P_{t_{k1}|t_{k1}} A_{t_k}^T + Q_{t_{k1}}$$

where $A_{tk}$ is a Jacobian of a SOC process model f.

Step 4: a Kalman Gain $K_{tk}$ is Given as:

$$K_{t_k} = P_{t_k|t_{k+}} H_{t_k}^T (H_{t_k} P_{t_k|t_{k+}} H_{t_k}^T + R_{t_{k+}})^{-1}$$

where $H_{tk}$ is a Jacobian of an observation model h.

Step 5: an a Posteriori Estimation:

$$x_{t_k|t_k} = x_{t_k|t_{k+}} + K_{t_k} [y_{t_k} - h(x_{t_k|t_{k+}}, u_k)]$$

Step 6: an Error Covariance Update:

$$P_{t_k|t_k} = (I_m - K_{t_k} H_{t_k}) P_{t_k|t_{k+}}$$

where $I_m$ is an identity matrix.

These and other aspects, objects, features, and advantages of the example embodiments will become apparent to those having ordinary skill in the art upon consideration of the following detailed description of example embodiments.

BRIEF DESCRIPTION OF THE DRAWINGS

An understanding of the features and advantages of the present disclosure will be obtained by reference to the following detailed description that sets forth illustrative embodiments, in which the principles of the disclosure may be utilized, and the accompanying drawings of which:

FIG. 6 shows TABLE I: battery specifications.

FIG. 7 shows TABLE II: parameter range for a $LiCoO_2$ battery.

FIG. 9 shows Table III: comparisons at different current profiles.

FIG. 16 shows Table IV: comparison of LS-EKF and RS-EKF.

Figure 1:
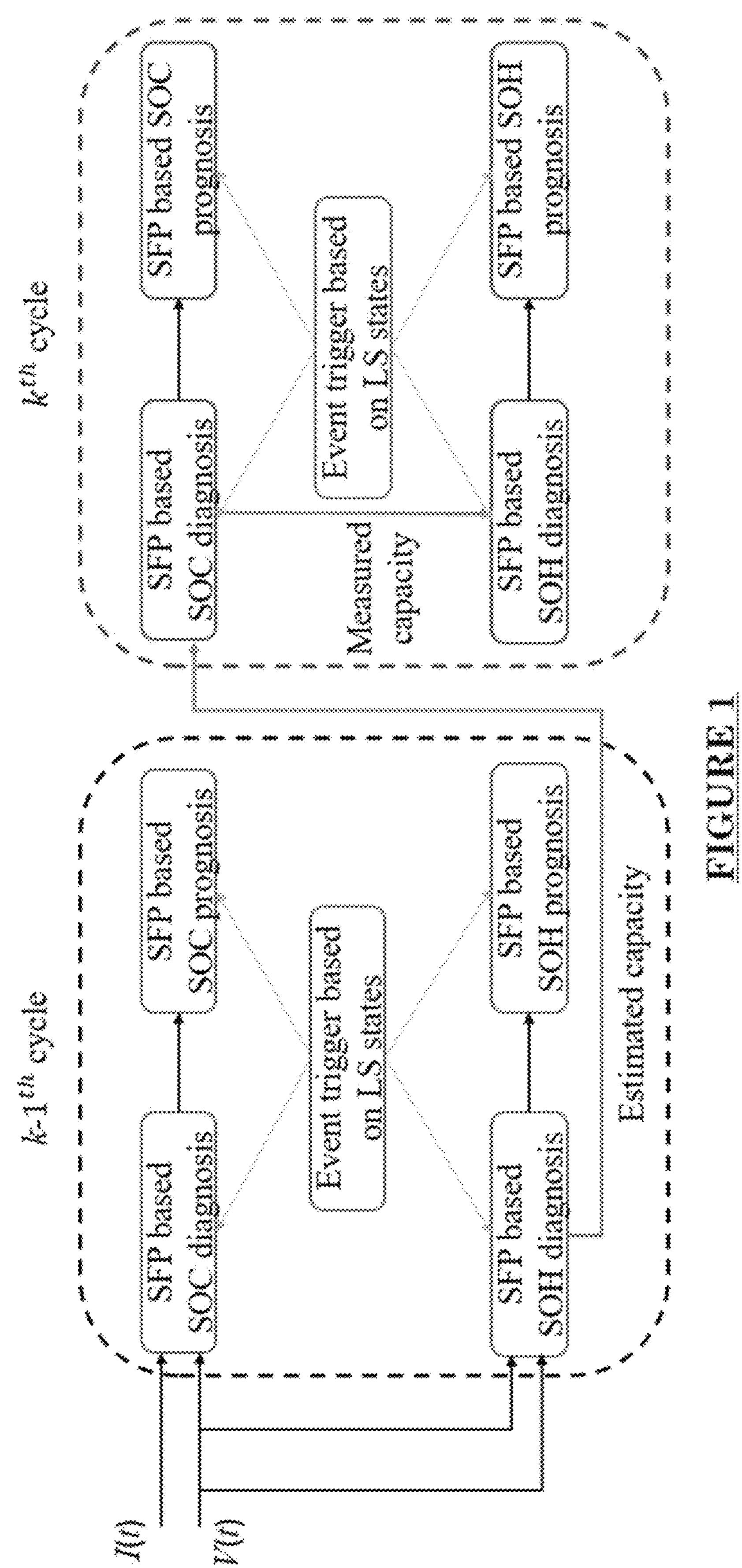
FIG. 1 shows a scheme of the proposed SOH and SOC estimation based on SFP under Lebesgue sampling framework.

The figures herein are for illustrative purposes only and are not necessarily drawn to scale.

DETAILED DESCRIPTION OF THE EXAMPLE EMBODIMENTS

Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting.

Unless specifically stated, terms and phrases used in this document, and variations thereof, unless otherwise expressly stated, should be construed as open ended as opposed to limiting. Likewise, a group of items linked with the conjunction “and” should not be read as requiring that each and every one of those items be present in the grouping, but rather should be read as “and/or” unless expressly stated otherwise. Similarly, a group of items linked with the conjunction “or” should not be read as requiring mutual exclusivity among that group, but rather should also be read as “and/or” unless expressly stated otherwise.

Furthermore, although items, elements or components of the disclosure may be described or claimed in the singular, the plural is contemplated to be within the scope thereof unless limitation to the singular is explicitly stated. The presence of broadening words and phrases such as “one or more,” “at least,” “but not limited to” or other like phrases in some instances shall not be read to mean that the narrower case is intended or required in instances where such broadening phrases may be absent.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are cited to disclose and describe the methods and/or materials in connection with which the publications are cited. All such publications and patents are herein incorporated by references as if each individual publication or patent were specifically and individually indicated to be incorporated by reference. Such incorporation by reference is expressly limited to the methods and/or materials described in the cited publications and patents and does not extend to any lexicographical definitions from the cited publications and patents. Any lexicographical definition in the publications and patents cited that is not also expressly repeated in the instant application should not be treated as such and should not be read as defining any terms appearing in the accompanying claims. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Where a range is expressed, a further embodiment includes from the one particular value and/or to the other particular value. The recitation of numerical ranges by endpoints includes all numbers and fractions subsumed within the respective ranges, as well as the recited endpoints. Where a range of values is provided, it is understood that each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure. For example, where the stated range includes one or both of the limits, ranges excluding either or both of those included limits are also included in the disclosure, e.g. the phrase “x to y” includes the range from ‘x’ to ‘y’ as well as the range greater than ‘x’ and less than ‘y’. The range can also be expressed as an upper limit, e.g. ‘about x, y, z, or less’ and should be interpreted to include the specific ranges of ‘about x’, ‘about y’, and ‘about z’ as well as the ranges of ‘less than x’, less than y', and ‘less than z’. Likewise, the phrase ‘about x, y, z, or greater’ should be interpreted to include the specific ranges of ‘about x’, ‘about y’, and ‘about z’ as well as the ranges of ‘greater than x’, greater than y', and ‘greater than z’. In addition, the phrase “about ‘x’ to ‘y’”, where ‘x’ and ‘y’ are numerical values, includes “about ‘x’ to about ‘y’”.

It should be noted that ratios, concentrations, amounts, and other numerical data can be expressed herein in a range format. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. Ranges can be expressed herein as from "about" one particular value, and/or to "about" another particular value. Similarly, when values are expressed as approximations, by use of the antecedent "about," it will be understood that the particular value forms a further aspect. For example, if the value "about 10" is disclosed, then "10" is also disclosed.

It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to 5%" should be interpreted to include not only the explicitly recited values of about 0.1% to about 5%, but also include individual values (e.g., about 1%, about 2%, about 3%, and about 4%) and the sub-ranges (e.g., about 0.5% to about 1.1%; about 5% to about 2.4%; about 0.5% to about 3.2%, and about 0.5% to about 4.4%, and other possible sub-ranges) within the indicated range.

As used herein, the singular forms "a", "an", and "the" include both singular and plural referents unless the context clearly dictates otherwise.

As used herein, "about," "approximately," "substantially," and the like, when used in connection with a measurable variable such as a parameter, an amount, a temporal duration, and the like, are meant to encompass variations of and from the specified value including those within experimental error (which can be determined by e.g. given data set, art accepted standard, and/or with e.g. a given confidence interval (e.g. 90%, 95%, or more confidence interval from the mean), such as variations of +/−10% or less, +/−5% or less, +/−1% or less, and +/−0.1% or less of and from the specified value, insofar such variations are appropriate to perform in the disclosure. As used herein, the terms "about," "approximate," "at or about," and "substantially" can mean that the amount or value in question can be the exact value or a value that provides equivalent results or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In general, an amount, size, formulation, parameter or other quantity or characteristic is "about," "approximate," or "at or about" whether or not expressly stated to be such. It is understood that where "about," "approximate," or "at or about" is used before a quantitative value, the parameter also includes the specific quantitative value itself, unless specifically stated otherwise.

The term "optional" or "optionally" means that the subsequent described event, circumstance or substituent may or may not occur, and that the description includes instances where the event or circumstance occurs and instances where it does not.

Various embodiments are described hereinafter. It should be noted that the specific embodiments are not intended as an exhaustive description or as a limitation to the broader aspects discussed herein. One aspect described in conjunction with a particular embodiment is not necessarily limited to that embodiment and can be practiced with any other embodiment(s). Reference throughout this specification to "one embodiment", "an embodiment," "an example embodiment," means that a particular feature, structure or characteristic described in connection with the embodiment is included in at least one embodiment of the present disclosure. Thus, appearances of the phrases "in one embodiment," "in an embodiment," or "an example embodiment" in various places throughout this specification are not necessarily all referring to the same embodiment, but may. Furthermore, the particular features, structures or characteristics may be combined in any suitable manner, as would be apparent to a person skilled in the art from this disclosure, in one or more embodiments. Furthermore, while some embodiments described herein include some but not other features included in other embodiments, combinations of features of different embodiments are meant to be within the scope of the disclosure. For example, in the appended claims, any of the claimed embodiments can be used in any combination.

All patents, patent applications, published applications, and publications, databases, websites and other published materials cited herein are hereby incorporated by reference to the same extent as though each individual publication, published patent document, or patent application was specifically and individually indicated as being incorporated by reference.

The proposed framework combines the advantages of the SFP and LS method, which results in low computation and small uncertainty accumulation. Compared with traditional SOH and SOC methods, the proposed SOH and SOC estimation method in this disclosure significantly improves the efficiency, simplifies the process, and improves accuracy.

For the current disclosure, SOH (state-of-health) diagnosis and prognosis: (1) the empirical model is used to estimate SOH; (2) the SOH diagnostic algorithm is conducted if a new measurement reaches predefined Lebesgue states; (3) the SOH prognostic algorithm is executed based on the Lebesgue sampling (LS) model to estimate distributions of operating time for the SOH state reaching each Lebesgue state.

The current disclosure also addresses SOC (State-of-charge) diagnosis and prognosis: (1) the SFP (simplified first principle) model is used to estimate SOC (state-of-charge) by calculating related internal states of the SFP model; (2) the SOC diagnostic algorithm is conducted if a new measurement reaches the predefined Lebesgue states with initial condition of battery capacity estimated on the last Lebesgue state; (3) the SOC prognostic algorithm is executed based on the LS model to estimate distributions of operating time for the SOC state reaching each Lebesgue state.

The current disclosure provides a high fidelity SFP Li-battery model, which can describe the internal electrochemical reaction mechanism accurately, is introduced to estimate SOH and SOC of Li-batteries. Lebesgue sampling (LS) is introduced with SFP model to overcome SFP's high computation and take the advantages of SFP's high fidelity. The proposed framework enables accurate SOH and SOC estimation based on the initial condition update method during the whole-life-service of Li-batteries.

The proposed framework combines the advantages of SFP and LS method, which results in low computation and small uncertainty accumulation. Compared with traditional SOH and SOC method, the proposed SOH and SOC estimation method in this application significantly improve the efficiency, simplify the process, and improve accuracy.

The innovation of this disclosure is the SFP model can describe the internal electrochemical reaction mechanism accurately for SOH and SOC estimation. The proposed framework combines the advantages of SFP and LS method, which results in low computation and small uncertainty accumulation. Further, the parameters and initial condition for SOC is updated according to SOH to enable accurate SOC estimation during the whole life service of battery. FIG. 1 shows a proposed scheme of the SOH and SOC estimation based on SFP under Lebesgue sampling framework.

The state-of-charge (SOC) estimation and remaining-dischargeable-time (RDT) prediction are critical and challenging to safe operation of Li-ion batteries. The main challenges are the limited accuracy of traditional equivalent circuit models and computation-inefficiency of electrochemical battery models. To address this problem, this disclosure proposes a Lebesgue-sampling-based extended Kalman filter (LS-EKF) approach that integrates the high-fidelity of a simplified first principle (SFP) model with the low computation of Lebesgue sampling (LS) in a Bayesian estimation framework. In this framework, the SFP model is first introduced along with its design and validation. The LS-EKF is employed with the SFP model to estimate the SOC and predict the RDT. The proposed method is verified with a series of experiments under different operating conditions. The results and comparisons demonstrate the effectiveness of the proposed method in terms of the accuracy of estimation and prediction, as well as the computational efficiency.

To address this problem, a Lebesgue sampling (LS)-based method was introduced. The LS-based method has an event-triggered execution scheme. When a new measurement becomes available, an event checker first checks if the measurement has transition from one Lebesgue state to another one, which indicates that the SOC has significant changes. Event checking or correlation automates the process of analyzing monitoring alerts from networks, hardware, and applications to detect incidents and problems. Using an event checker/correlation tool makes management of enterprise systems, applications and services easier and improves their performance and availability.

In computing, generally, an event is an occurrence or action initiated either by the battery system or by a user. Event checking/correlation can focus on events in which the result is not normal and signifies a problem. Event correlation software ingests monitoring alerts, alarms and other event signals, such as a battery life state of health signal, detects meaningful patterns amid the deluge of information and identifies incidents and changes. Advances in artificial intelligence, including machine learning, have strengthened event checking/correlation. AI enables platforms to continuously improve checking/correlation algorithms using the data they ingest and user input or user actions. This innovation, part of a trend called Artificial Intelligence for IT Operations (AIOps), makes the analysis of event data, the detection of problems and the surfacing of their root cause more efficient.

If an event occurs, the algorithm is executed to calculate a new SOC estimation. With the new SOC estimation, the RDT prediction algorithm is executed with an Lebesgue time model (LTM) to predict the operation time distribution for battery SOC reaching predefined Lebesgue states and RDT is the one when SOC reaching the Lebesgue state defined on the end-of-discharge threshold. If no event occurs, it indicates the SOC does not have much change and the algorithm is not executed. In this case, the SOC estimation and RDT prediction from the previous sampling instant is used. The main advantage of LS-based method is its low computation, high accuracy, and low uncertainty accumulation.

The contributions are summarized as follows: 1) a LTM is developed from the SFP model in the LS framework; 2) EKF is developed in the LS framework and is integrated with the SFP model and LTM for SOC estimation and RDT prediction; and 3) a series experiments under constant and dynamic load profiles are conducted for verification and validation. This disclosure is organized as follows: Section II provides the SFP model. Section III illustrates the framework of the LS based method and develops the SOC estimation algorithm based on the SFP model under the LS-based EKF (LS-EKF) framework. Section IV presents the validation of SFP model and the developed algorithms by applications to a series of batteries under various working conditions. Section V gives the conclusion.

II. Simplified First Principle Model

The high fidelity battery model makes it possible to realize accurate SOC estimation and RDT prediction. This section introduces a SFP model that incorporates OCV, solid-phase and liquid-phase diffusion, reaction polarization, and ohmic polarization in a closed-form. It is worth noting that this disclosure focuses on computation reduction and accuracy improvement by applying the LS-EKF algorithm to the SFP model. For this reason, this disclosure only considers room temperature and thermal coupling is ignored.

A. Open Circuit Voltage

The Open Circuit Voltage (OCV) is directly determined by the solid-phase surface concentration of the particles of both positive and negative electrodes, which can be described as:

$$E_{OCV}(t) = \underset{p}{U}(y_{surf}(t)) - U_n(x_{surf}(t)) \tag{1}$$

where $E_{ocv}$ is the open-circuit voltage; $U_p$ and $U_n$ are the OCV of positive and negative electrodes; $y_{surf}$ and $x_{surf}$ are the solid-phase surface concentration of particles of positive and negative electrodes, respectively.

Note that $y_{surf}$ and $x_{surf}$ equal to the average solid-phase concentration $y_{avg}$ and $x_{avg}$ of positive and negative electrodes, respectively, after the current I becomes zero for a while. The $y_{avg}$ and $x_{avg}$ are defined as:

$$y_{avg}(t) = y_0 + \frac{I(t)\cdot t}{Q_p};\; x_{avg}(t) = x_0 - \frac{I(t)\cdot t}{Q_n} \tag{2}$$

where $y_0$ and $x_0$ are the initial values of $y_{avg}$ and $x_{avg}$, respectively; $Q_p$ and $Q_n$ are the capacities of the effective active materials of positive and negative electrodes, respectively.

B. Solid-Phase Diffusion

When current I is not zero, $y_{surf}$ and $x_{surf}$ are different from $y_{avg}$ and $y_{avg}$. They can be described as:

$$y_{surf}(t) = y_{avg}(t) + \Delta y(t);\; x_{surf}(t) = x_{avg}(t) - \Delta x(t) \tag{3}$$

where Δy and Δx are the difference given as:

$$\Delta y(t) = \Delta y_s(t) + \frac{2}{7} \cdot \frac{\tau_{sp}}{Q_p} I(t) \tag{4}$$

$$\Delta x(t) = \Delta x_s(t) + \frac{2}{7} \cdot \frac{\tau_{sn}}{Q_n} I(t)$$

in which the derivatives of $\Delta y_s(t)$ and $\Delta x_s(t)$ satisfy:

$$\Delta y_s'(t) = \frac{1}{\tau_{sp}}\left[\frac{12}{7} \cdot \frac{\tau_{sp}}{Q_p} I(t) - \Delta y_s(t)\right] \tag{5}$$

$$\Delta x_s'(t) = \frac{1}{\tau_{sn}}\left[\frac{12}{7} \cdot \frac{\tau_{sn}}{Q_n} I(t) - \Delta x_s(t)\right]$$

where $\tau_{sp}$ and $\tau_{sn}$ are the solid-phase diffusion time constants of the positive and negative electrode, respectively.

C. Liquid-Phase Diffusion

The effect of liquid-phase diffusion describes the concentration difference at the current collectors of both electrodes and directly determines the electrolyte overpotential $\eta_e$, which can be described as:

$$\eta_e(t) - \frac{2RT}{F}(1 - t_+) \ln\left[\frac{c_0 + \Delta c(t)}{c_0 - \Delta c(t)}\right] \tag{6}$$

where R is the ideal gas constant; T is the temperature; F is the Faraday's constant; $t_+$ is the transport number of the Li-ions; $c_0$ is the initial liquid-phase Li-ions concentration, and Δc is the degree of concentration polarization resulted from liquid-phase diffusion, which can be calculated as:

$$\Delta c(t) = P_{con} I\left(1 - e^{-\frac{t}{\tau_e}}\right) \tag{7}$$

where $P_{con}$ and $\tau_e$ are the proportion coefficient and liquid phase diffusion time constant, respectively, and the derivative of Δc satisfies:

$$\Delta c'(t) = \frac{1}{\tau_e}[P_{con} I(t) - \Delta c(t)] \tag{8}$$

D. Reaction Polarization

According to Butler-Volmer kinetics, the reaction polarization overpotential $\eta_{act}$ can be expressed as:

$$\eta_{act}(t) = \frac{2RT}{F}\left\{\ln\left[\sqrt{m_n^2(t) + 1} + m_n(t)\right] + \ln\left[\sqrt{m_n^2(t) + 1} + m_p(t)\right]\right\} \tag{9}$$

$$m_p(t) = \frac{1}{6Q_p c_0^{0.5}} \frac{1}{(1 - y_{surf})^{0.5}(y_{surf})^{0.5}} P_{actp} I(t)$$

$$m_n(t) = \frac{1}{6Q_n c_0^{0.5}} \frac{1}{(1 - x_{surf})^{0.5}(x_{surf})^{0.5}} P_{actn} I(t)$$

where $P_{actp}$ and $P_{actn}$ are the reaction polarization coefficients of positive and negative electrodes, respectively, which reflect the electrochemical reaction rate inside the battery.

E. Ohmic Polarization

The ohmic polarization overpotential $\eta_{ohm}$ is given as:

$$\eta_{ohm}(t) = R_{ohm} I(t) \tag{10}$$

where Rohm is a lumped parameter related to the ohmic polarization, which can be directly measured.

F. Brief Summary

The SFP model describes the internal electrochemical reactions including five processes: open-circuit voltage, solid-phase diffusion, liquid-phase diffusion, reaction polarization, and ohmic polarization. The terminal voltage $U_T$ is given as:

$$U_T(t) = E_{ocv}(t) - \eta_e(t) - \eta_{act}(t) - \eta_{ohm}(t) \tag{11}$$

The SFP model has a total number of 11 parameters, i.e., $x_0$, $y_0$, $Q_n$, $Q_p$, $\tau_{sn}$, $\tau_{sp}$, $\tau_e$, $P_{con}$, $P_{actp}$, $P_{actn}$ and $R_{ohm}$.

Compared with ECM, the developed SFP model describes battery electrochemical and dynamic processes more accurately on the micro-scale. By integrating with a properly designed estimation method in the next section, highly accurate SOC estimation and RDT prediction can be obtained.

III. LS-EKF for SOC Estimation and RDT Prediction

Since SOC cannot be measured directly, it needs to be estimated by the observed data. The SOC is often defined as the ratio between the remaining usable charge and the total charge, which can be calculated based on the Coulomb counting method, see K. Ng, C. Moo, Y. Chen, and Y. Hsieh. Enhanced Coulomb counting method for estimating state-of-charge and state-of-health of lithium-ion batteries. *Applied Energy,* 86(9):1506-1511, 2009:

$$soc(t) - soc_0 - \frac{\int I(t)dt}{Q_{all}} \tag{12}$$

where $Q_{all}$ the total capacity, and its value is measured by the battery from fully charged state to the cutoff voltage at 1-C rate; $soc_0$ is the initial SOC value of the battery; I(t) is the current, with the sign being considered positive for discharge and negative for charge, respectively. Traditional Coulomb counting based methods suffer from unknown initial conditions and noises in current measurements, which make it insufficient for accurate SOC estimation, especially for batteries working as battery packs or for a long period of time. To increase the accuracy and robustness of SOC estimation and RDT prediction, this disclosure focuses on two issues: the establishment of a high-fidelity battery model and the development of an efficient algorithm.

In traditional RS-based methods, samples are taken periodically and the algorithms are executed in a periodic manner. Due to the computation complexity of the SFP model, its application to real-time applications is severely limited, especially for those distributed ones that rely on embedded systems or microprocessors. To address this problem, a computationally effective method based on the SFP model is proposed in the LS-EKF framework, which integrates the advantage of the high fidelity of SFP model and the low computation of LS.

A. Lebesgue Sampling Method

Figure 2:
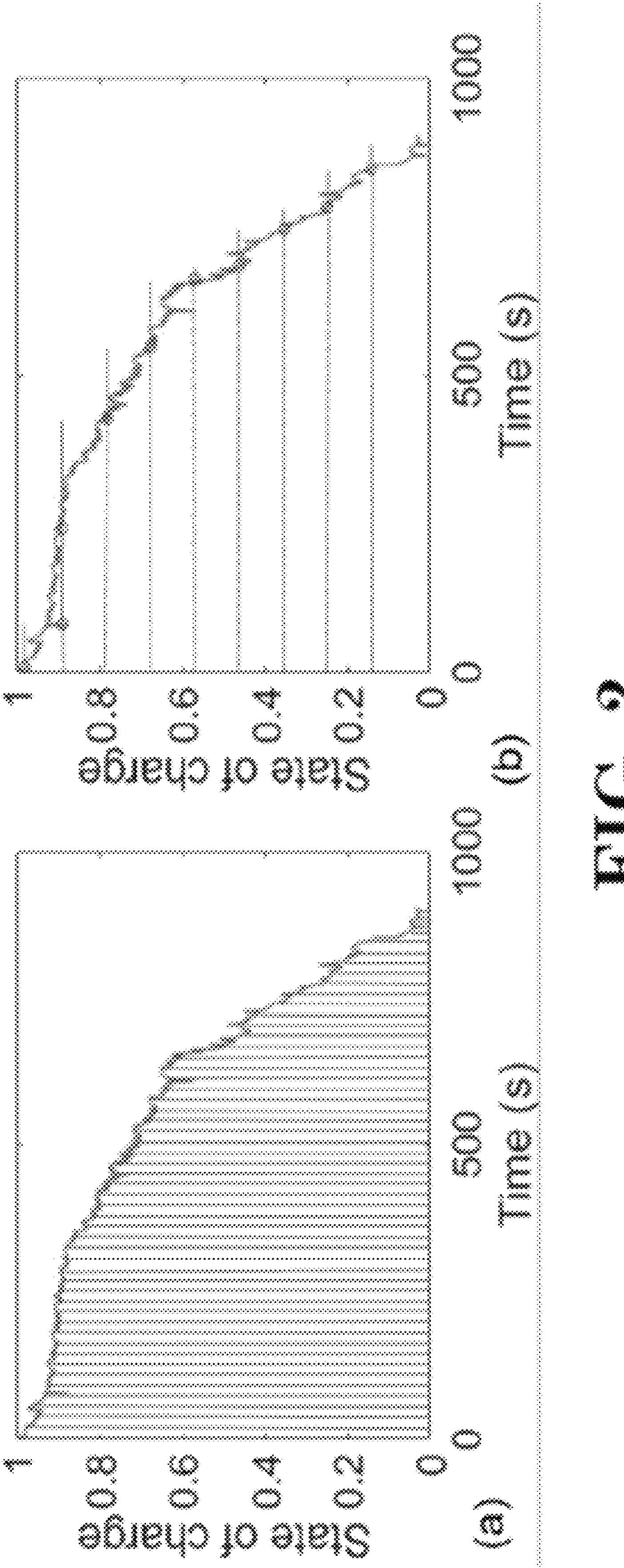
FIG. 2 shows a comparison between RS and LS frameworks at: (a) RS with fixed time interval; and (b) LS with fixed Lebesgue length.

The differences between RS and LS are illustrated by a battery SOC degradation process. The RS, FIG. 2 at (a), shows that the SOC measurement is collected (by Coulomb counting) at every sampling time instant. FIG. 2 shows a comparison between RS and LS framework at: (a) RS with fixed time interval; and (b) LS with fixed Lebesgue length.

As the measurement becomes available, the SOC estimation algorithm is executed, and RDT is predicted. Therefore, the algorithm is executed periodically according to the sampling rate. This method, although ensuring high accuracy, causes significant unnecessary computations, especially when the SOC does not have obvious changes or decreases slowly. Ideally, the frequency of the implementation of SOC estimation should be proportional to the SOC changing rate. That is, when the SOC changes fast (slow), the algorithm for SOC estimation should have more (less) executions. This can be naturally realized by LS, FIG. 2 at (b). In LS, the SOC space is divided into a number of Lebesgue states, as indicated by the horizontal lines. The LS based SOC algorithm is executed only when the SOC measurement changes from one Lebesgue state to another (namely, an event happens), which indicates that the SOC has significant changes and SOC estimation needs to be updated. This ensures that the computation is greatly reduced, while the accuracy is within a reasonable range. It is worth noting that the SOC from Coulomb counting, noted as $soc_m$, is treated as SOC measurement and is used to check against the predefined Lebesgue states for events.

Figure 3:
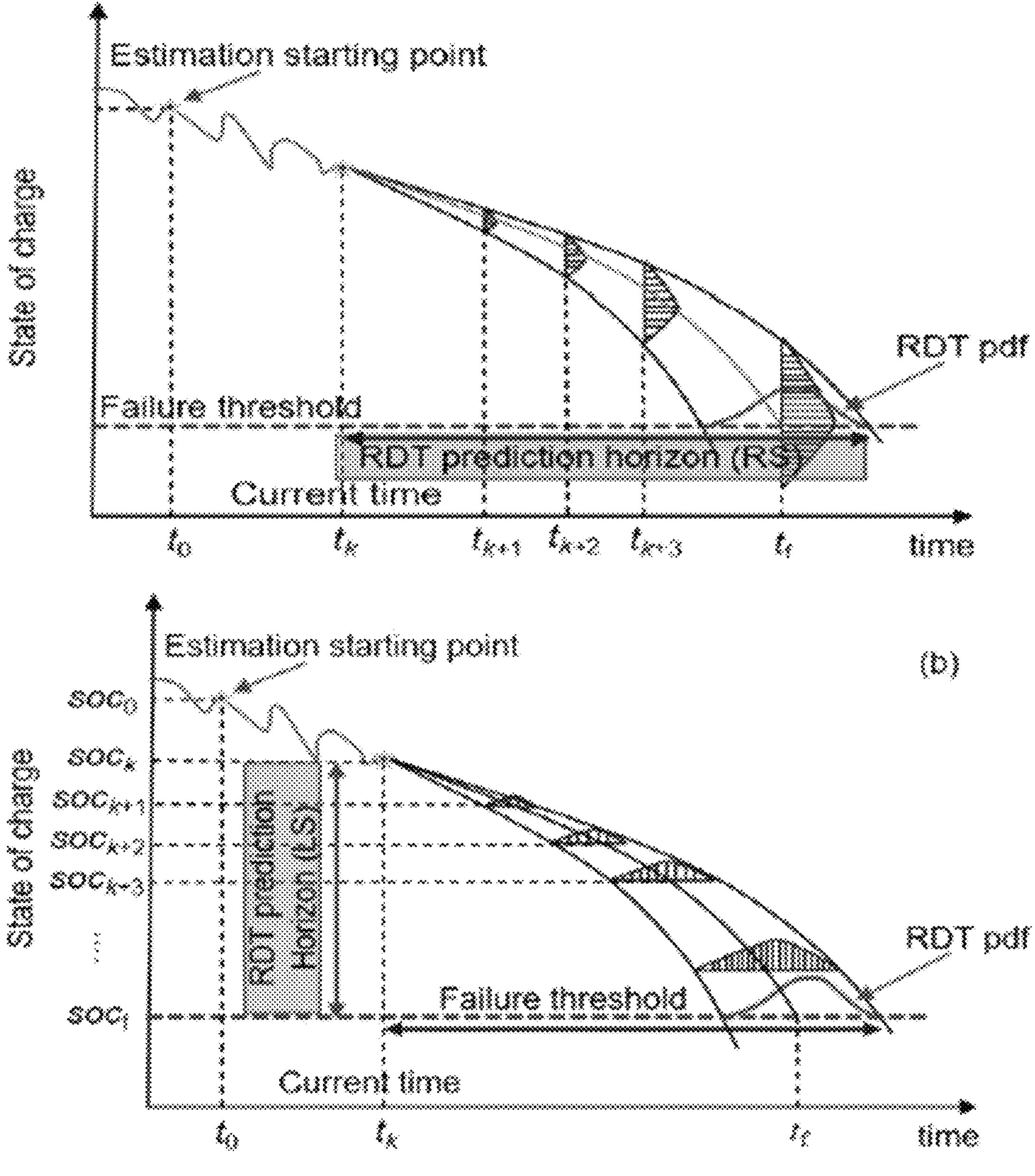
FIG. 3 shows a comparison between RS-based and LS-based prognosis at: (a) RS-based prognosis; and (b) LS-based prognosis.

FIG. 3 shows the difference between RS-based RDT prediction and LS-based RDT prediction. For the RS-based method, FIG. 3 at (a), the prediction is conducted along the time axis to predict the probability distribution function (PDF) of the SOC state at all future time instants. The predicted SOC state PDF is then compared against the SOC end-of-discharge threshold according to the law of total probability to get the RDT PDF. Since no measurement is available in the prediction, the prediction uncertainty accumulates and the SOC PDF variance increases along the prediction horizon ($t_k$, $t_{k+1}$, . . . , $t_f$) on the time axis. On the contrary, LS-based method, FIG. 3 at (b), uses a LTM to directly predict the operation time PDF for the SOC degrading to the predefined Lebesgue states. The RDT PDF is given for the Lebesgue state defined on the end-of-discharge threshold. FIG. 3 shows a comparison between RS-based and LS-based prognosis at: (a) RS-based prognosis; and (b) LS-based prognosis FIG. 3 shows that the prediction horizon for LS-based method is usually much smaller than that of the RS-based method, especially for fault degradation with slow dynamics. Due to this short horizon, the uncertainty accumulation of LS-based prognosis is much smaller than that of the RS-based prognosis. This means that the LS-based prognosis can reduce the computational complexity and improve the prediction accuracy simultaneously.

The major difference is summarized as follows. The RS-based SOC estimation is executed periodically every time when a measurement becomes available. The RS-based prognosis needs to predict the states at all future time instants before it reaches the failure threshold. This usually leads to large uncertainty accumulation and requires a lot of computation. On the contrary, the LS-based SOC estimation is executed with an event checker along the state axis and is only executed when an event happens. The LS-based prognosis directly predict the RDT PDF on each predefined Lebesgue state, which has low computation and high prediction accuracy.

B. LS-EKF for SFP Model-Based SOC Estimation

EKF is generally used for SOC estimation due to its simplicity and good performance in dealing with nonlinearities. As mentioned early, RS-based EKF is not efficient for real-time implementation based on EMs. This section develops a new method that integrates the SFP model and LS-EKF to reduce the computation cost while maintaining high accuracy.

For LS-based estimation, the state estimation model and observation model are given as:

$$x_{t_{k+1}} = f(x_{t_k}, u_{t_k}, D) + \omega_{t_k} \tag{13}$$

$$y_{t_k} = h(x_{t_k}) + v_{t_k} \tag{14}$$

where $x_{t_k}$ is the state; $u_{t_k}$ is the input, such as current and temperature; D is the Lebesgue state length; $y_{t_k}$ is the measurement, and f and h are nonlinear process and observation models, respectively; and are Gaussian noises with zero-mean and covariance of $Q_{t_k}$ and $R_{t_k}$, respectively. Here, subscript $t_k$ is an event stamp when the measurement triggers an event. Note that D is the distance between two adjacent Lebesgue states, which is defined based on the requirements of estimation accuracy and computation resources.

The implementation process of the LS-EKF algorithm for state estimation is as follows:

Step 1: Initialization $$P_{0|0} = E\left\{ \begin{array}{c} x_{0|0} = E(x_0) \\ [x_0 - E(x_0)][x_0 - E(x_0)]^T \end{array} \right\} \tag{15}$$

where $x_{0|0}$ is the initial value of the SOC state; E(·) is the expectation; $P_{0|0}$ is the initial covariance matrix.

Step 2: the a Priori State Estimation $$x_{t_k|t_{k+}} = f(x_{t_{k+}|t_{k+}}, u_{t_k}, D) \tag{16}$$

Step 3: the Covariance Matrix Calculation $$P_{t_k|t_{k+}} = A_{t_k} P_{t_{k+}|t_{k+}} A_{t_k}^T + Q_{t_{k+}} \tag{17}$$

where $A_{tk}$ is the Jacobian of the SOC process model f.

Step 4: the Kalman Gain $K_{tk}$ is Given as:

$$K_{t_k} = P_{t_k|t_{k+}} H_{t_k}^T (H_{t_k} P_{t_k|t_{k+}} H_{t_k}^T + R_{t_{k+}})^{-1} \tag{18}$$

where $H_{tk}$ is the Jacobian of the observation model h.

Step 5: the a Posteriori Estimation:

$$x_{t_k|t_k} = x_{t_k|t_{k+}} + K_{t_k}[y_{t_k} - h(x_{t_k|t_{k+}}, u_k)] \tag{19}$$

Step 6: the Error Covariance Update:

$$P_{t_k|t_k} = (I_m - K_{t_k} H_{t_k}) P_{t_k|t_{k+}} \tag{20}$$

where $I_m$ is the identity matrix.

With the given initial condition, steps 2~6 are implemented recursively when an event happens to get the state estimation at $t_k$.

In order to estimate SOC based on the SFP model, it is necessary to build the relationship between model variables and SOC. In the SFP model in Section II, Eqs. (1), (3), (4) and (5) show that the $y_{avg}$ and $x_{avg}$ directly determine the OCV. For fully charged batteries with initial charge $soc_0=1$. Combining Eqs. (2) and (12), we have:

$$y_{avg}(t) = y_0 + (Q_{all}/Q_p)(1 - soc(t)) \tag{21}$$
$$x_{avg}(t) = x_0 - (Q_{all}/Q_n)(1 - soc(t))$$

Then, $y_{avg}$ and $x_{avg}$ can be discretized as:

$$y_{avg,t_k} = y_0 + (Q_{all}/Q_p)(1 - soc_{t_k}) \tag{22}$$
$$x_{avg,t_k} = x_0 - (Q_{all}/Q_n)(1 - soc_{t_k})$$

By integrating the SFP model with LS-EFK, the implementation is described as follows:

The state estimation model is given as $$soc_{t_k} = soc_{t_{k1}} - (P_d, \bar{I}_{t_{k1},t_k} \cdot \Delta t)/Q_{all} + \omega_{d,t_k} \tag{23}$$

where $P_d$ is the hyperparameter; $\Delta t=t_k-t_{k-1}$ is the time duration in two adjacent events; $\bar{I}_{t_{k-1},t_k}$ is the mean current value in $[t_{k-1}, t_k]$, and $w_{d,t_k}$ is the noise of SOC estimation model. Then, the Jacobian matrix $A_{t_k}$ of (23) is equal to 1.

The observation model is given as $$U_{T,t_k}^{sim} = h_{SFP}(I_{t_k}, y_{avg,t_k}, x_{avg,t_k}) + v_{d,t_k} \tag{24}$$

where $v_{d,t_k}$ is the noise of the observation model; $h_{SFP}(\cdot)$ is a lumped nonlinear function from SFP model that describes the dynamics of terminal voltage $U_{T,t_k}$ under the influence of current $I_{tk}$ and internal variables such as $y_{avg,t_k}$ and $x_{avg,t_k}$. Given $I_{tk}$ and $h_{SFP}(\cdot)$, the simulated terminal voltage $$U_{T,t_k}^{sim}$$

can be calculated from the SFP model. It is worth noting that there are two measurement variables: $soc_m$ and $U_T$. The $soc_m$ is used as a measurement to check if an event is triggered. When an event happens, the algorithm is executed. The difference between $U_{T,t_k}$ and $$U_{T,t_k}^{sim}$$

is used to calculate the a posteriori SOC estimation based on (19).

The nonlinear function $h_{SFP}(\cdot)$ is linearized to calculate the Jacobian matrix $H_{tk}$, which is given as:

$$H_{t_k}|_{soc_{t_k}} = \frac{U_T^{sim}(soc_{t_k} + \delta soc) - U_T^{sim}(soc_{t_k})}{\delta soc} \tag{25}$$

where $\delta soc$ should be set to a small value, generally less than 0.01, which is application dependent; $H_{t_k|soc_{tk}}$ is the derivative of the $$U_{T,t_k}^{sim}$$

with respect to $soc_{t_k}$. The confidence of the state estimation model and the observation model can be adjusted by changing $w_{d,t_k}$ and $v_{d,t_k}$.

Figure 4:
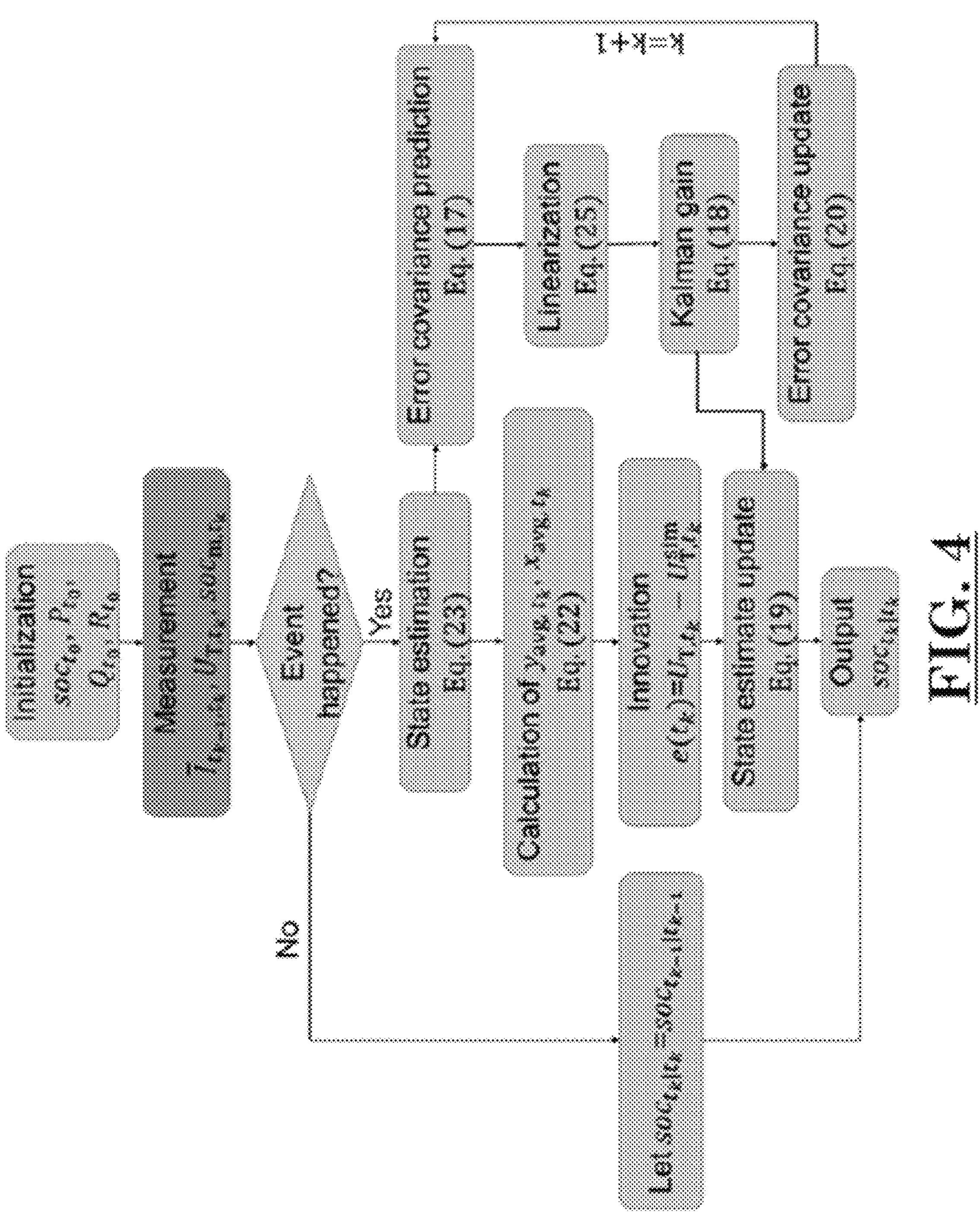
FIG. 4 shows a LS-EKF for SOC estimation based on the SFP model.

In LS-EKF for SOC estimation, the a priori SOC is first obtained by (23), and then $y_{avg,t_k}$ and $x_{avg,t_k}$ are calculated by (22), which is used to get $$U_{T,t_k}^{sim}$$

from (24). The error between and $U_{T,t_k}$ and $$U_{T,t_k}^{sim}$$

is used to update the a priori SOC estimation to get the a posteriori estimation. The SOC estimation procedure shown in FIG. 4 is described as follows. FIG. 4 shows LS-EKF for SOC estimation based on the SFP model.

Step 1: Set the initial value of state $soc_{t_o}$ to and the initial matrices of $P_{t_o}$, $Q_{t_o}$, $R_{t_o}$;

Step 2: Calculate the a priori estimation $soc_{t_k|t_{k+}}$ and a priori error covariance matrix $P_{t_k|t_{k+}}$;

Step 3: Calculate the Jacobian matrix $H_{t_k}$, Kalman gain matrix $K_{t_k}$ and update the a priori error covariance matrix $P_{t_{k+1}|t_k}$ based on Eqs. (20), (18) and (25);

Step 4: Calculate $y_{avg,t_k}$ and $x_{avg,t_k}$, according to (22) by using the a priori estimation soc $c_{t_k|t_{k+}}$;

Step 5: Calculate error $e_{t_k}$ between $$U_{T,t_k}^{sim}$$

and $U_{T,t_k}$,

Step 6: Update soc $c_{t_k|t_{k+}}$ according to error $e_{t_k}$ and gain $K_{t_k}$ to get the a posteriori estimation $soc_{t_k|t_k}$. Let k=k+1;

Step 7: Determine whether an event is triggered based on $soc_m$ at the next sampling instant; if yes, go through steps 2-6 to update the SOC estimation. Otherwise, the LS-EKF algorithm is not implemented and the SOC estimation results from the previous event is used.

In the implementation, the initial SOC is set to 0.6 manually since the true SOC is unknown at the beginning. The values of $w_{d,t_o}$ and $v_{d,t_o}$ are set to 0.003 and 0.0015, respectively.

Then, initial $Q_{t_o}$ and $R_{t_o}$, are given as $9e^{-6}$ and $2.25e^{-6}$, respectively. The initial covariance matrix $P_{t_o}$ is calculated to 0 according to (15).

C. LS-EKF for SFP Model-Based RDT Prediction.

RDT can be defined from different aspects. Some works define RDT as the end of discharge time when the terminal voltage reaches the lower cutoff voltage, see C. Sbarufatti, M. Corbetta, M. Giglio, and F. Cadini. Adaptive prognosis of lithium-ion batteries based on the combination of particle filters and radial basis function neural networks. *Journal of Power Sources,* 344:128-140, 2017, while others define the discharge end time according to SOC, see G. Dong et al. Since the definition based on SOC is more reasonable for real applications, this disclosure defines RDT as the discharge end time when SOC drops below the SOC threshold.

With this RDT definition, the LTM is developed for the LS-EKF-based prognosis to predict the operation time reaching each predefined Lebesgue state.

Eq. (2) can be discretized as:

$$\mathcal{Y}_{avg}, t_{k+1} = \mathcal{Y}_{avg,t_k} + \frac{\bar{I}_{t_k,t_{k+1}} \cdot (t_{k+1} - t_k)}{Q_p} \tag{26}$$

$$\mathfrak{X}_{avg}, t_{k+1} = \mathfrak{X}_{avg,t_k} - \frac{\bar{I}_{t_k,t_{k+1}} \cdot (t_{k+1} - t_k)}{Q_n}$$

Combining Eqs. (22) and (26), we have:

$$\begin{aligned} t_{k+1} &= f_p\left(t_k, D, \bar{I}_{t_k,t_{k+1}}\right) + \omega_{p,t_k} \\ &= t_k + P_p \cdot Q_{all} \cdot D / \bar{I}_{t_k,t_{k+1}} + \omega_{p,t_k} \end{aligned} \tag{27}$$

$$\Upsilon_{t_{k+1}|t_k} = G_{t_k} \Upsilon_{t_k|t_k} G_{t_k}^T + S_{t_k} \tag{28}$$

where $P_p$ is hyperparameter; $\ddot{I}_{t_k,t_{k+1}}$ is the mean value of the current in $[t_k, t_{k+1}]$; D is the Lebesgue state length; $w_{p,t_k}$ is a Gaussian noise term with covariance $S_{t_k}$; $G_{t_{k+}}$ is the Jacobian of (27), and is 1 according to (27); $c_{t_k|t_{k+}}$ $_{t_{k+1}|t_k}$ is the covariance matrices of the predicted time distribution.

Eq. (27) is the LTM for RDT prediction that predicts the operation time distribution for SOC reaching each predefined Lebesgue state. Since the process of long-term RDT prediction does not involve new measurement, there is no update.

Note that the output of SOC estimation is the SOC state estimation, which needs to be converted to the corresponding time distribution. This time distribution is then used as the initial condition for LS-EKF based RDT prediction. Moreover, to obtain the time measurements for building the LTM, a two side checker is used.

IV. Experimental Verification

Figure 5:
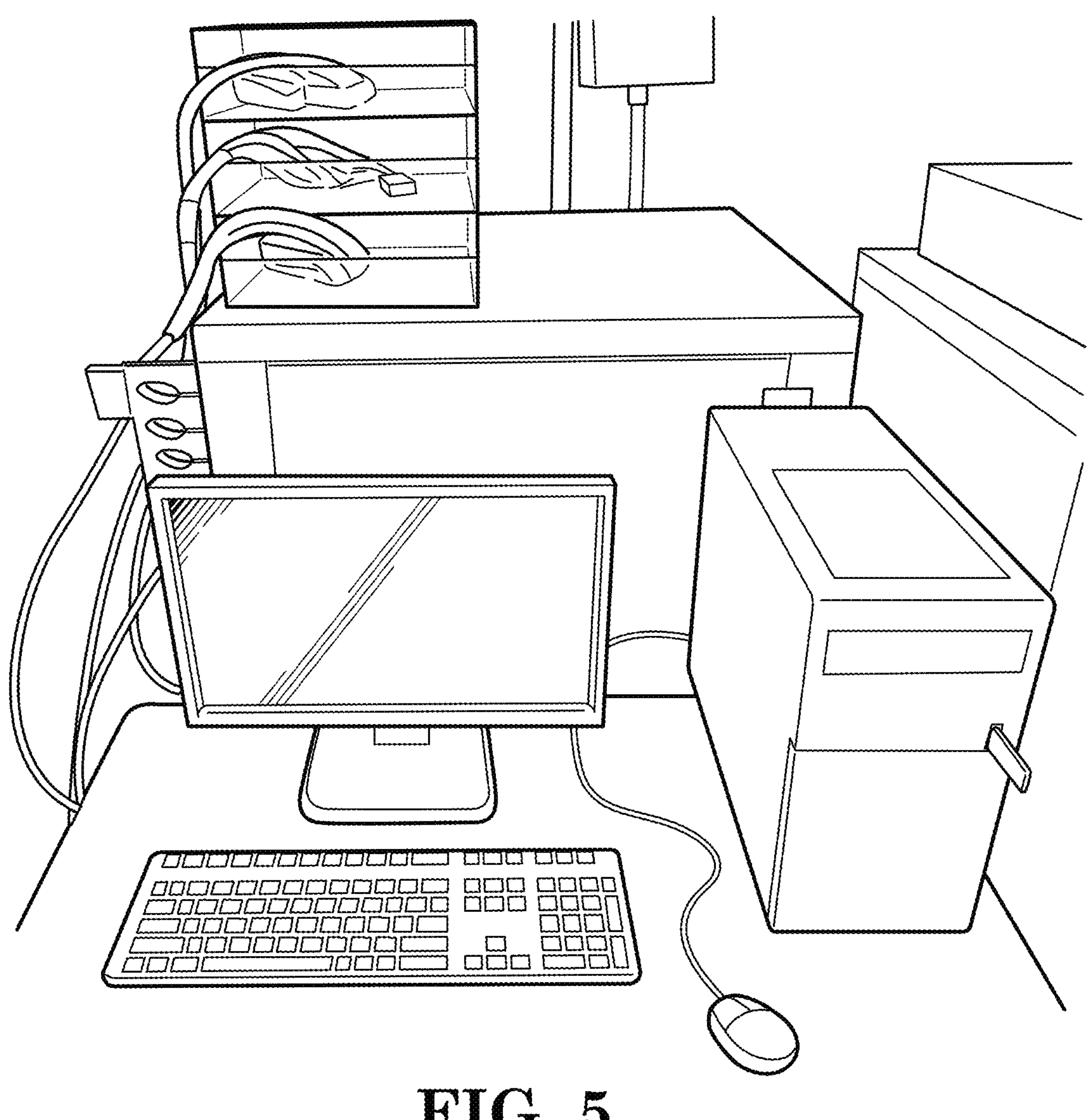
FIG. 5 shows a photograph of an Arbin BT2000 test system used with the present disclosure.
Figure 8:
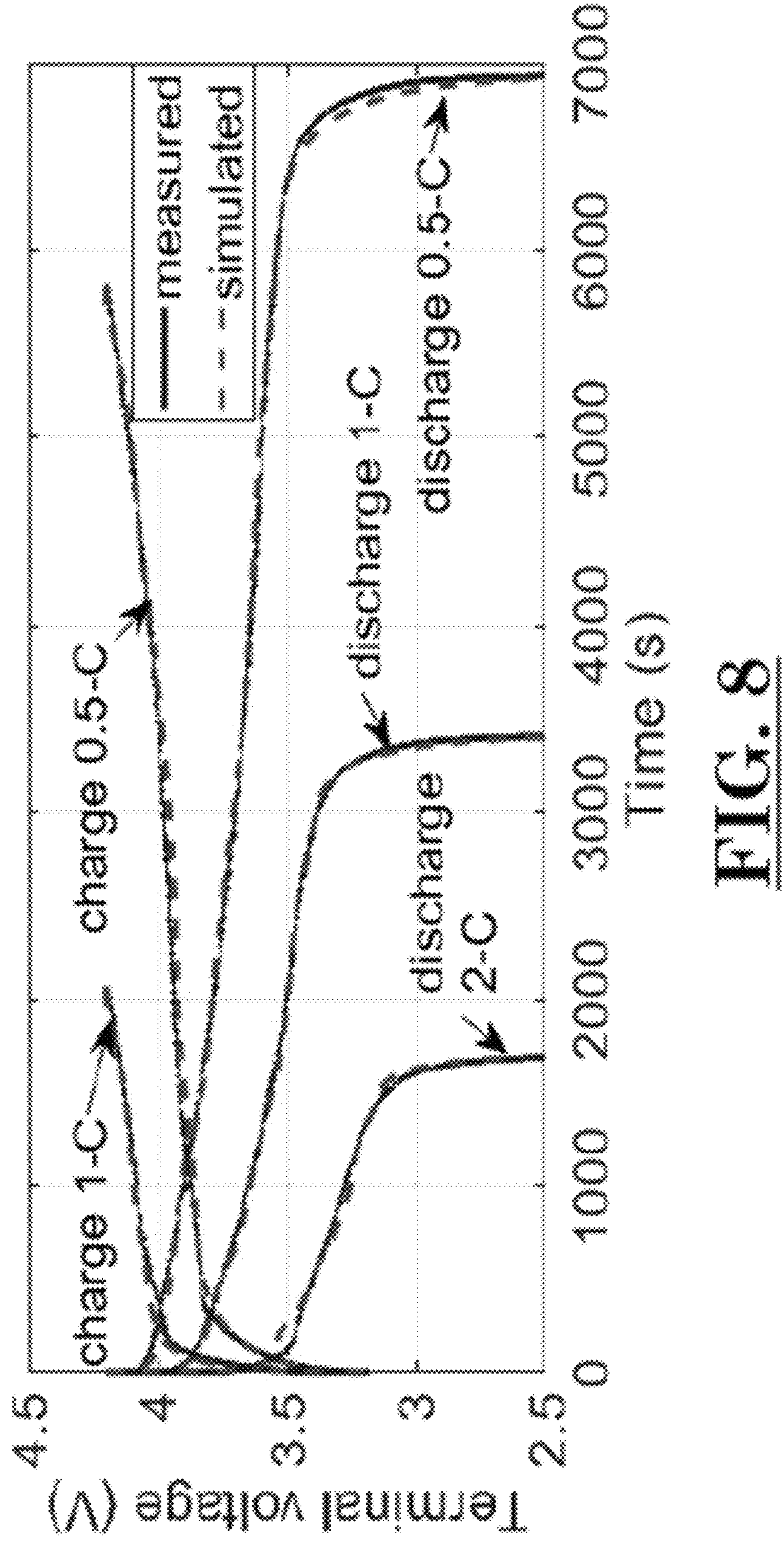
FIG. 8 shows comparisons between simulations and measurements of terminal voltage at different constant charge/discharge rates.

This section demonstrates the proposed method with an application to a Sanyo 14500 LiCoO2/graphite battery with a nominal capacity of 820 mAh. Table I summarizes the battery specifications. Experimental data (current and voltage) are acquired by an Arbin BT2000 test system, FIG. 5 shows the Arbin BT2000 test system for experiments, under room temperature with a 1 Hz sampling rate. Software such as SMBus 1.1 or 2.0, or others known to those of skill in the art, may be used to compare data collected from the battery with data measured directly. FIG. 6 shows Table 1 containing battery specifications. The ranges of model parameters are listed in Table II, see FIG. 7. It is worth noting that some parameters are optimized by particle swarm optimization, see J. Zhang and P. Xia. An improved PSO algorithm for parameter identification of nonlinear dynamic hysteretic models. *Journal of Sound and Vibration,* 389:153-167, 2017, for better modeling performance. FIG. 8 shows comparisons between simulations and measurements of terminal voltage at different constant charge/discharge rates. FIG. 9 shows Table III, comparisons at different current profiles.

A. Model Validation

With the given model parameters and the observed data of current and terminal voltage, the simulated and measured terminal voltage under different charging/discharging rates and dynamic stress test (DST) profiles, see Battery test manual for electric vehicles. online: inldigitallibrary.inl.gov/sites/STI/STI/6492291.pdf. Accessed: 2021 Feb. 19, are compared to validate the SFP model. DST is a widely used dynamic driving profile to evaluate the performance of the battery life.

The details of the testing procedure are as follows: (1) Fully charge the battery: Charge at a 0.5-C rate, 1-C rate and 2-C rate, respectively, until the terminal voltage $U_T$ reaches the cutoff voltage of 4.2 V, followed by a constant voltage charging process at 4.2 V until the charging current $I_c$ reaches the cutoff current of 0.02-C rate; (2) Discharge the battery at different constant rates: Discharge at 0.5-C rate, 1-C rate and 2-C rate, respectively, until $U_T$ reaches the cut-off voltage of 2.5 V; (3) Fully charge the battery as (1); (4) Conduct DST of ten cycles; (5) Discharge the battery at 1-C rate until $U_T$ reaches the cut-off voltage of 2.5 V.

1) Validation under constant charge/discharge rates: FIG. 5 shows the comparison at different but constant current charging/discharging rates. For 0.5-C rate, the average absolute error (AAE) between the simulated and measured terminal voltage is 16.5 mV for discharging and 23.1 mV for charging, respectively. For 1-C rate current, the AAE is 25.6 mV for discharging and 27.7 mV for charging, respectively. For 2-C rate current discharging, the AAE increases to 41.3 mV.

The comparison shows that the developed SFP model can accurately describe the battery behaviors. It is worth noting that the AAE is proportional to the charging/discharging rate. The reason is that the developed SFP model does not consider the uneven reaction processes of the internal electrochemical process. The greater the charging/discharging rate, the greater the degree of uneven reaction processes.

Fundamentally, the methods of the current disclosure can be evaluated by a variety of digital and analog devices. While the use of optical computers may be possible, we expect that typical implementations will be done on systems integrated with or associated with batteries, such as systems associated with the device the battery is powering or the battery itself, such as, a digital computer. It is possible to execute the algorithms on hardware ranging from small stationary or handheld devices to the largest of supercomputers. Applications suitable for small consumer devices might include battery state of health and charge remaining, while more powerful machines will be required for precise measurements/estimates and fast throughput. The results of the analysis may be stored onto a volatile or non-volatile storage medium such as a hard disk drive, a flash memory, or other suitable storage medium, and the results of the analysis may be displayed on a computer CRT (terminal), any other display device, printed out on paper, or printed on any other suitable medium.

The algorithms used herein may be parallelizable and consequently can be implemented either by a single processor or by a large number of processors. Parallel implementations can be constructed using multiple processors that operate on different (but somewhat overlapping) sections of the battery, as well as assigning the processors to different batteries within a battery array.

Figure 10:
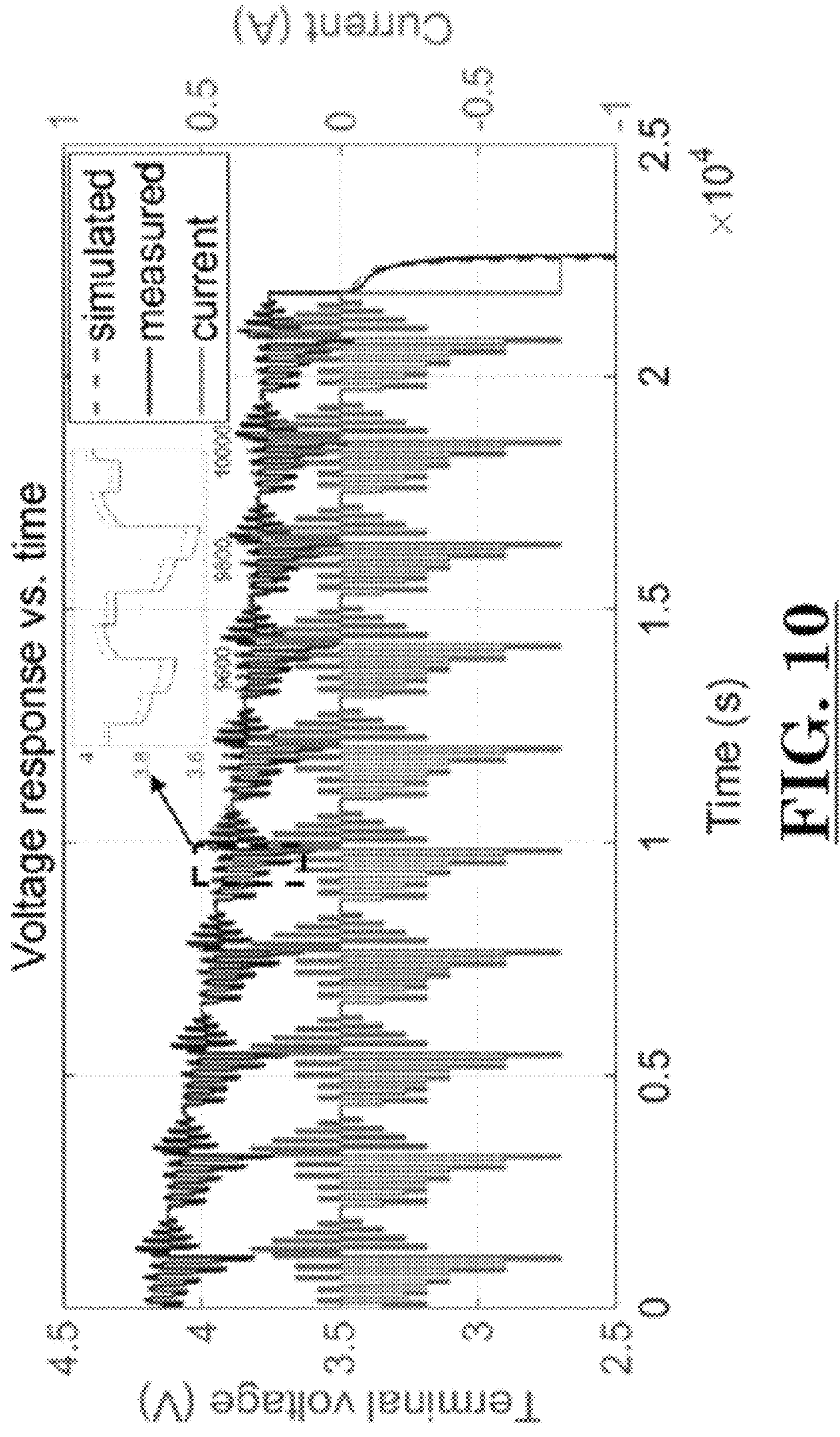
FIG. 10 shows a comparison between simulation and measurement of battery terminal voltage under DST profile.

2) Validation under DST profile: FIG. 10 shows the current and voltage profiles of the DST. FIG. 10 shows a comparison between simulation and measurement of battery terminal voltage under DST profile. In this DST, each profile consists of a series of constant discharging/charging steps with a total duration of 60 seconds, in which the current varies from 0.5-C rate charging to 1-C rate discharging.

The results under DST profiles in FIG. 10 has an AAE of about 28.6 mV. The zoom-in subfigure shows that the simulated voltage matches the measured voltage well. This further validates the developed SFP model, which lays a solid foundation for further applications of SOC estimation and RDT prediction. Table III summarizes the results of validation in terms of AAE and maximum absolute error (MAE).

B. SOC Estimation and RDT Prediction Results by the LS-EKF

Following the experiments in model validation, a series of experiments under various constant currents and DST were carried out to validate the proposed LS-EKF based SOC estimation and RDT prediction approach. In the experiments, the computing time was based on a computer with Intel Core i7-3770 CPU @ 3.4 GHz.

1) Constant 1-C discharge rate: FIGS. 7 and 8 show the results with 1-C rate, in which the LS-EKF is executed 54 and 138 times at the 1000th second and the 2000th second, which save (1000−54)/1000=94.6% and (2000−138)/2000=93.1% computation, respectively. Moreover, the initial SOC converges to true SOC in about 145 seconds, i.e., after 145 measurements are processed and the algorithm is only executed 9 times.

The RDT prediction is conducted by propagating the operating time PDF at the current Lebesgue state into future Lebesgue states. The RDT distribution is obtained on the Lebesgue state defined on the end-of-discharge threshold. FIG. 8 shows the RDT prediction at the 1000th and 2000th seconds.

For 1-C rate, the prediction horizon is 135 and 78 Lebesgue states in the future 2276 and 1276 sampling data points at the 1000th and 2000th seconds, which saves 94.06% and 93.9% computation, respectively. For RDT prediction PDF, it has a mean of 3526 seconds and 95% CI (confidence interval) of [3516 3534] at the 1000th second. At the 2000th second, it has a mean of 3433 seconds and 95% CI of [3426 3439]. Compared with the ground truth RDT of 3273, the differences between the ground truth and the predictions are 253 and 160 seconds at the 1000th and 2000th seconds, respectively. The RDT prediction deviation from the ground truth 3273 seconds is 253/3273=7.7% and 160/3273=4.88%, respectively.

Figure 11:
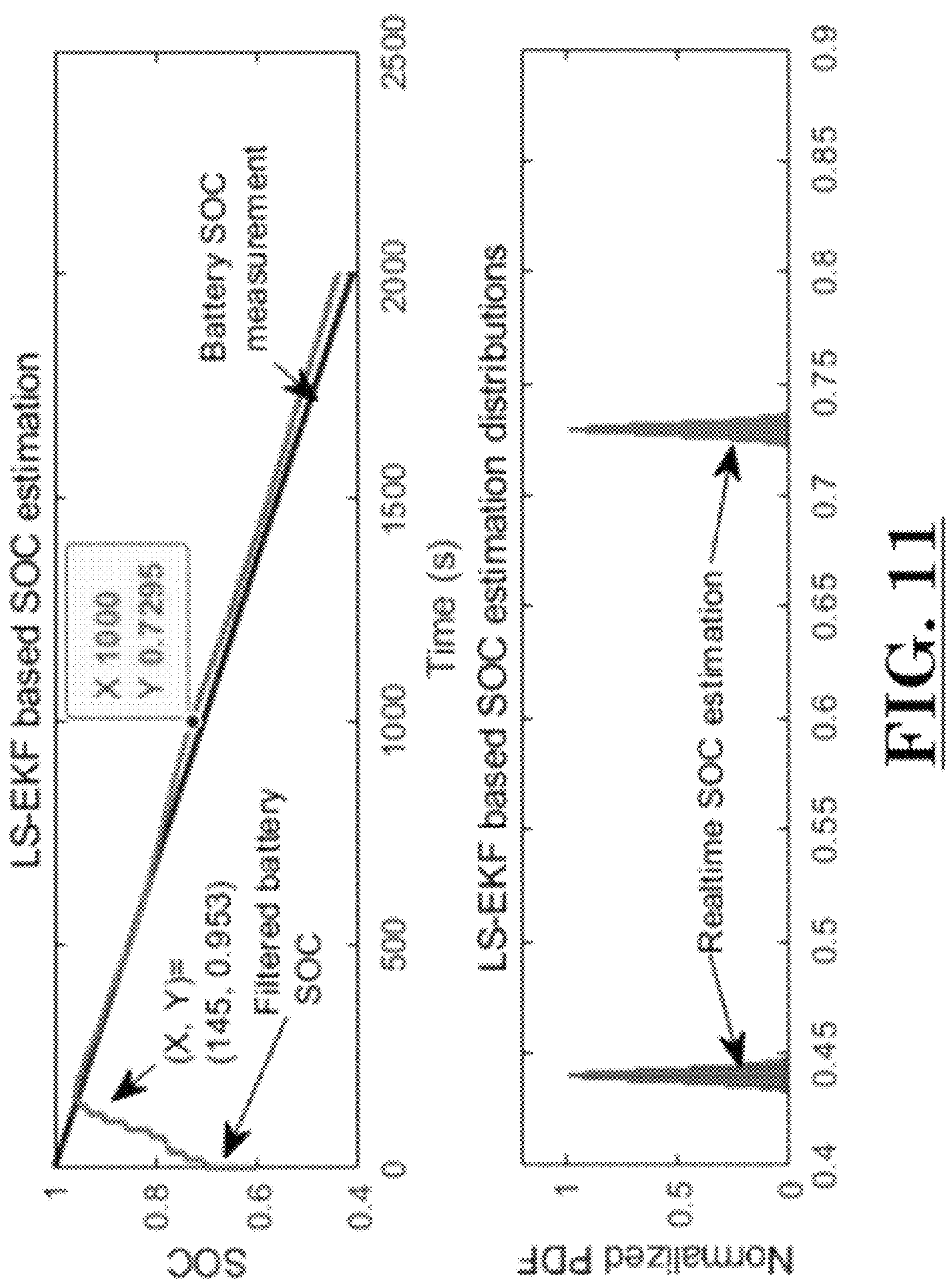
FIG. 11 shows LS-EKF based SOC estimation for 1-C rate at the 1000th and 2000th seconds.
Figure 12:
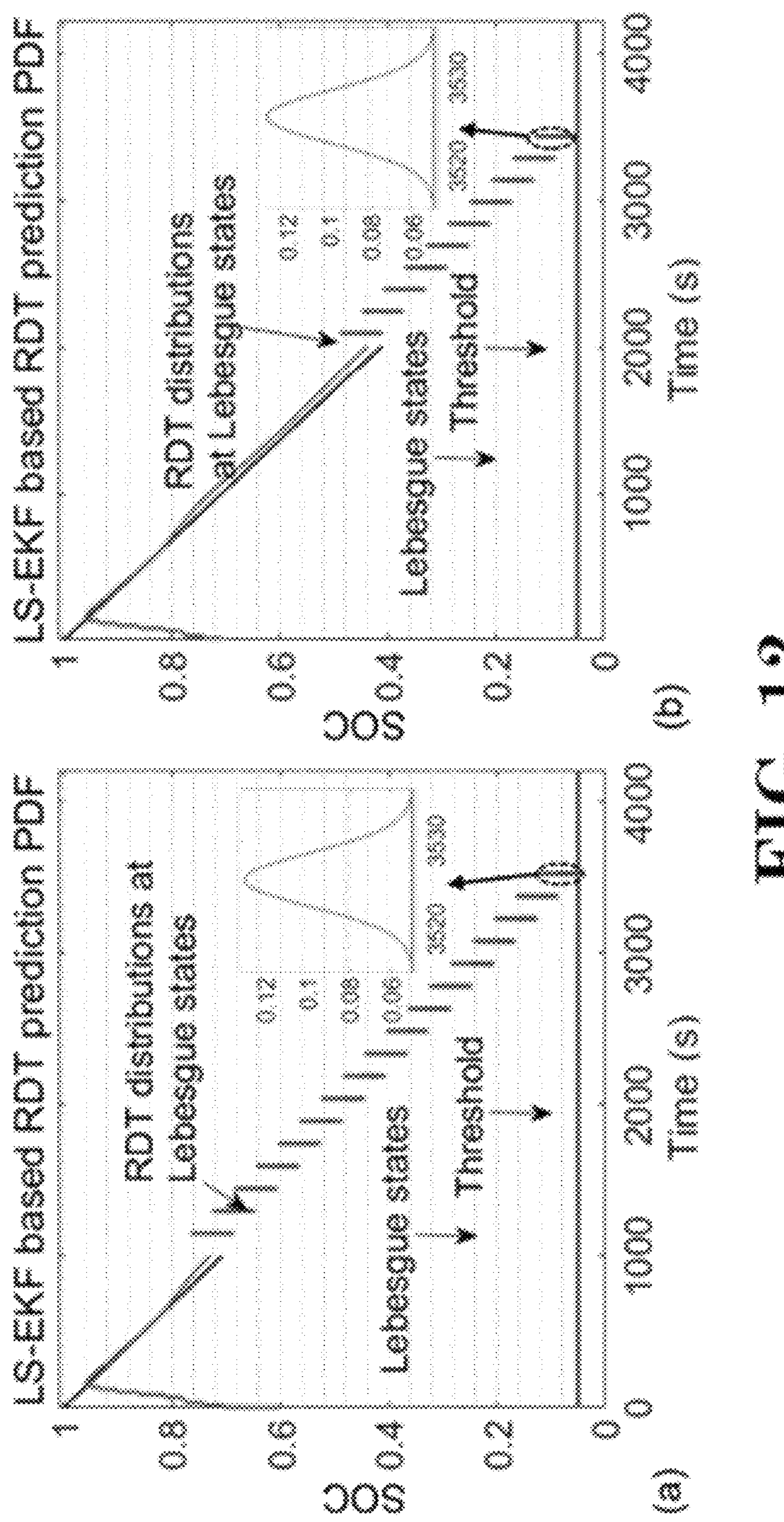
FIG. 12 shows LS-EKF based RDT prediction at 1-C rate.
Figure 13:
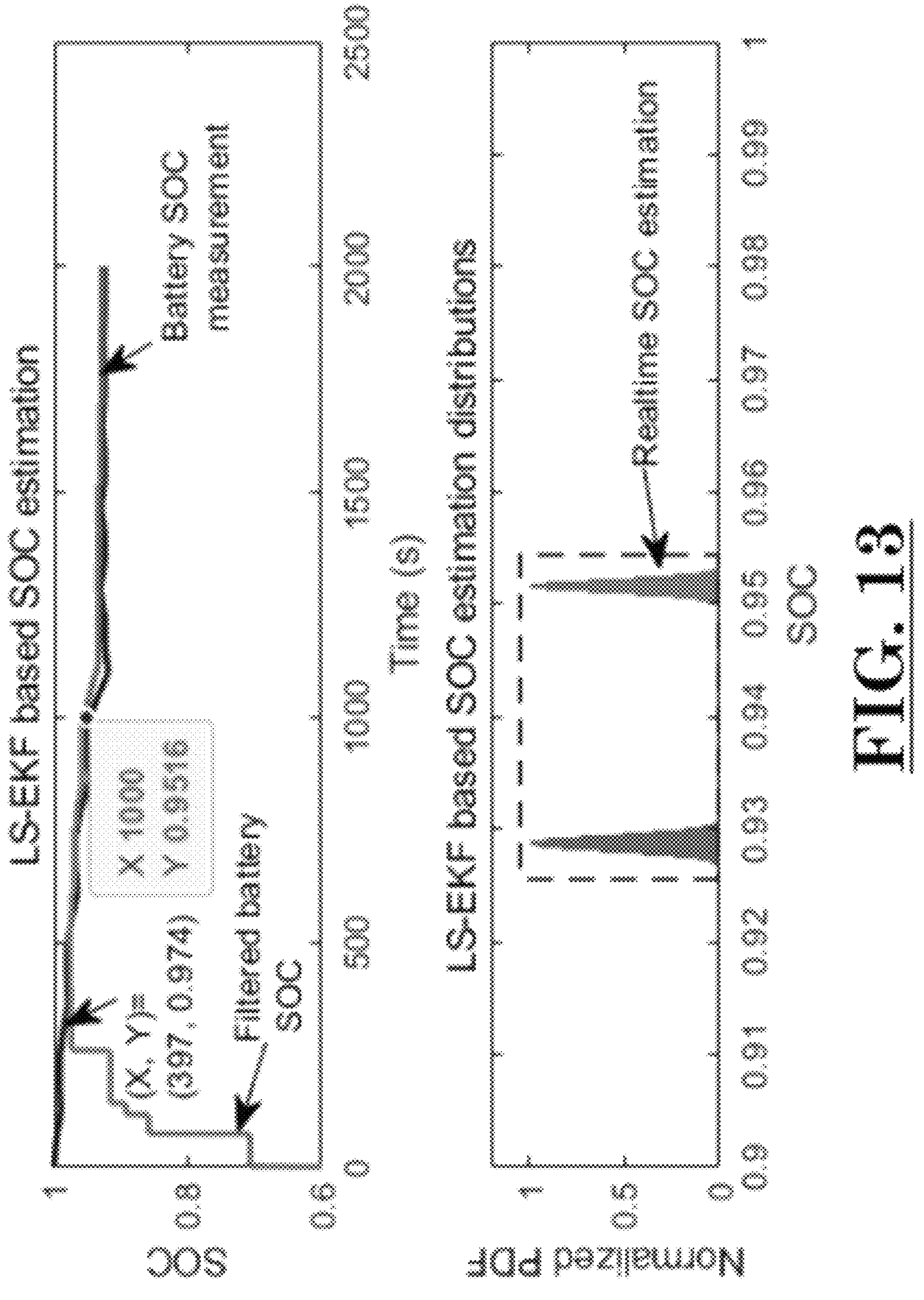
FIG. 13 shows LS-EKF based SOC estimation under DST at the 1000th and 2000th seconds.
Figure 14:
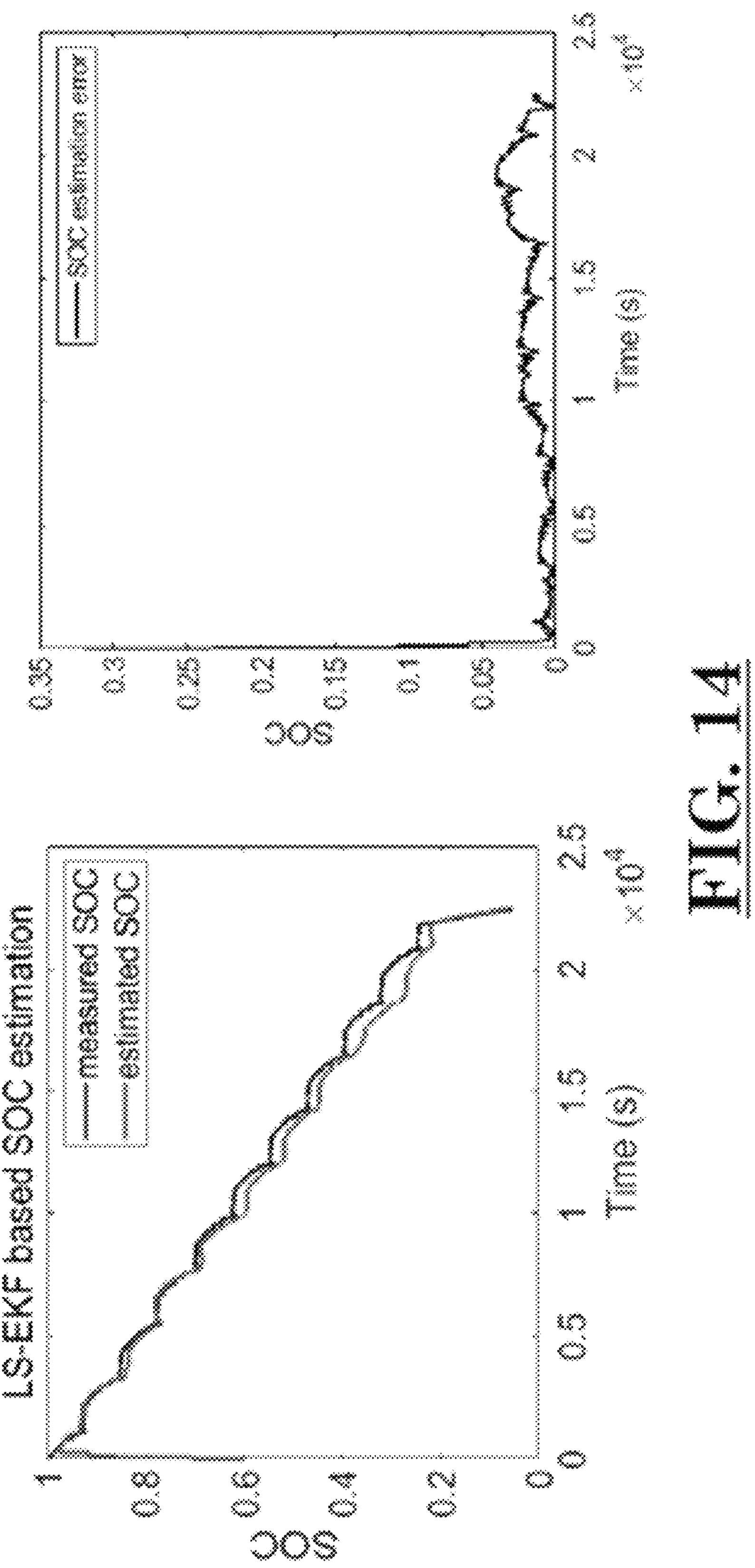
FIG. 14 shows LS-EKF based SOC estimation under DST for whole service life.
Figure 15:
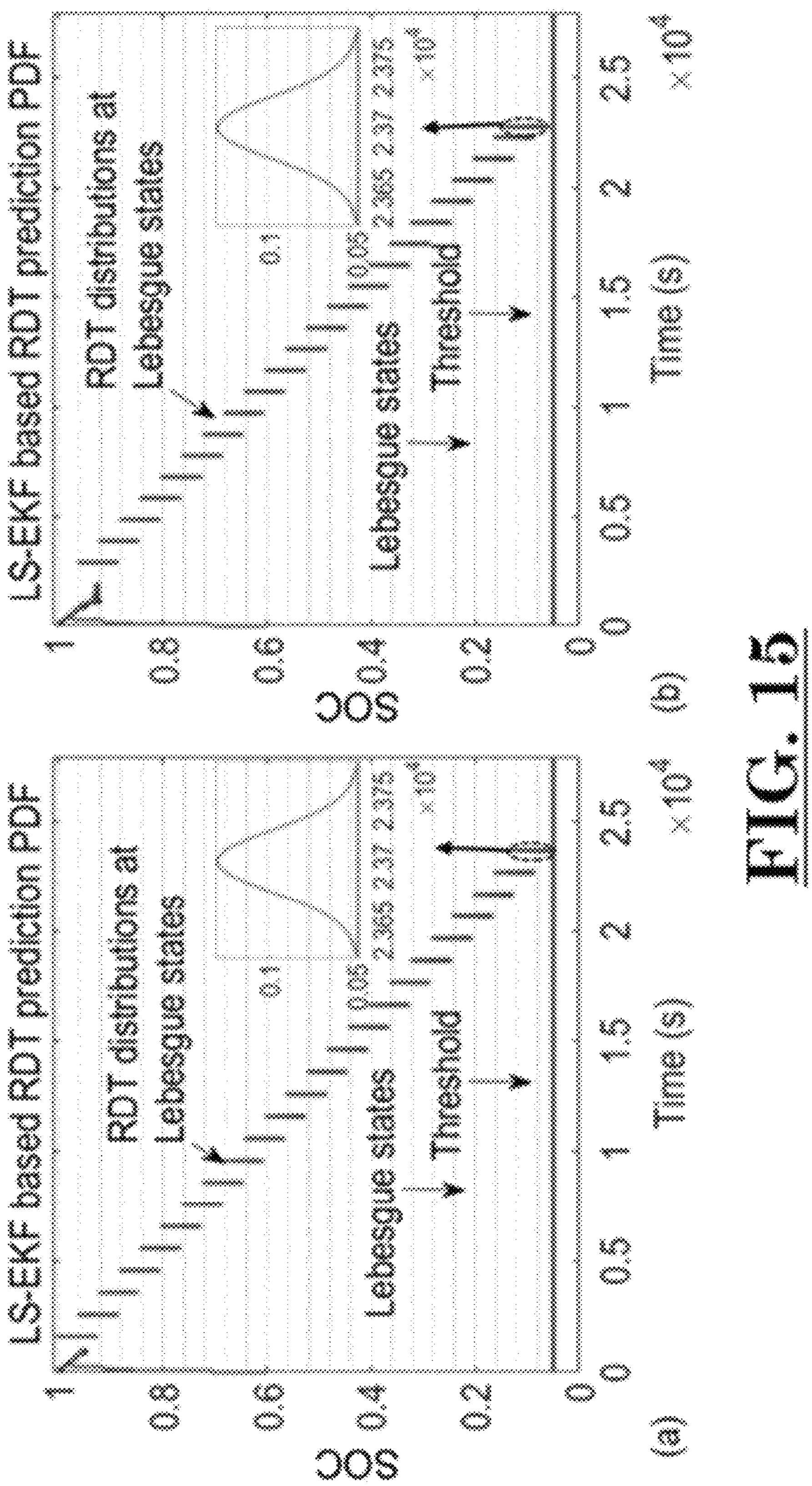
FIG. 15 shows LS-EKF based RDT prediction under DST.

2) DST profile: FIGS. 9, 10, and 11 show the results under DST profile. FIG. 11 shows LS-EKF based SOC estimation for 1-C rate at the 1000th and 2000th seconds. FIG. 12 shows LS-EKF based RDT prediction at 1-C rate FIG. 13 shows that, in the first 1000 seconds and 2000 seconds, LS-EKF is executed 13 and 28 times, which saves 98.7% and 98.6% computation, respectively. FIG. 13 shows LS-EKF based SOC estimation under DST at the 1000th and 2000th seconds. Under DST, the initial SOC converges at about 397th second, i.e., after 397 measurements are processed and the algorithm is executed only 6 times. FIG. 14 shows the SOC estimation under the DST profile during the whole discharge process. FIG. 14 shows LS-EKF based SOC estimation under DST in the whole service life. FIG. 15 shows LS-EKF based RDT prediction under DST. FIG. 16 shows Table IV, a comparison of LS-EKF and RS-EKF. The AAE of SOC estimation is 2.51%, and the MAE is less than 4.8%. The results show the effectiveness of LS-EKF under DST.

For RDT prediction, the prediction horizon is 180 and 176 Lebesgue states in future 21500 and 20500 sampling data points at the 1000th and 2000th seconds, which saves 99.2% and 99.1% computation, respectively. At the 1000th second, the RDT prediction PDF has a mean of 23704 seconds and a 95% CI of [23632 23774]. While at the 2000th second, it has a mean of 22763 seconds and 95% CI of [22698 22830].

Compared with the ground truth RDT of 22510 seconds, the differences are 1194 and 253 seconds, respectively, which corresponds to 5.3% and 1.12% error, respectively. The results indicate that LS-EKF has good performance in terms of computation efficiency and RDT prediction accuracy. Moreover, the short prediction horizon leads to small uncertainty accumulation and benefits uncertainty management.

3) Comparison study: This section presents comparison of LS-EKF with RS-EKF based on the proposed SFP model. Table IV compares the results at different constant discharge rates and under DST at the 1000th second.

Constant rates: Compared with 1000 executions of the RS-EKF, the LS-EKF only has 54 and 107 executions at 1-C and 2-C discharge rates, respectively. The computation cost of LS-EKF is 5.4% and 10.7% of that of RS-EKF, respectively. For RDT prediction at 1-C and 2-C rates, the computation time of LS-EKF is 5.0% (0.0254/0.508) and 9.87% (0.0156/0.158) of that of the RS-EKF, respectively.

Figure 17:
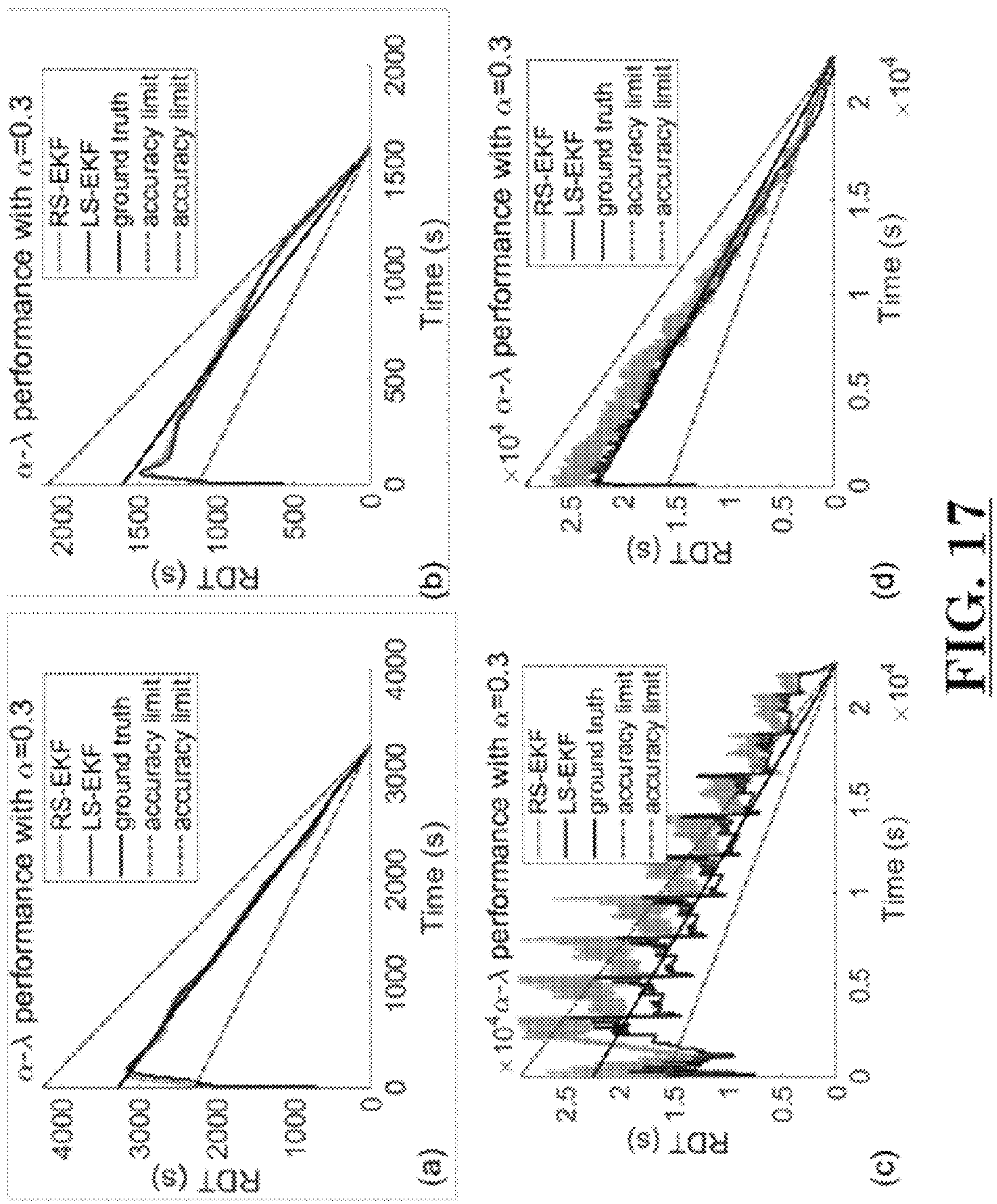
FIG. 17 shows RDT prediction comparison at: (a) 1-C rate; (b) 2-C rate; (c) DST with unknown future current profile; and (d) DST with partially known future current profile.

To compare RDT prediction accuracy in the entire discharge process, $\alpha-\lambda$ metrics with $\alpha$=0.3 is used, see A. Saxena, J. Celaya, B. Saha, S. Saha, and K. Goebel. Metrics for offline evaluation of prognostic performance. *International Journal of Prognostics and Health Management,* 1(1):4-23, 2010, FIG. 17 at (a) and (b). FIG. 17 shows a RDT prediction comparison at: (a) 1-C rate; (b) 2-C rate; (c) DST with unknown future current profile; and (d) DST with partially known future current profile. It shows that LS-EKF has comparable prediction accuracy with RS-EKF at constant discharge rates.

DST: Compared with 1000 executions of the RS-EKF, the LS-EKF only has 12 executions, which saves 98.8% computation cost. Table IV shows that the SOC estimation errors based on the LS-EKF are as low as that based on RS-EFK. For RDT prediction, two case studies are presented. The first one assumes the future current profile is unknown and the mean value of current in the past one cycle of the DST (2000 sampling time instants) is used for RDT prediction, FIG. 17 at (c). The second one assumes the future current profile is partially known, such as a robot with a planned path in a partially known environment, FIG. 17 at (d). The RDT prediction results of this case study are also summarized in Table IV. The two figures demonstrates that the RDT prediction accuracy of LS-EKF is better than that of RS-EKF under DST. FIG. 17 at (c) shows that the RDT prediction sometimes exceeds the accuracy limits. This is mainly because the input current used in this scenario varies greatly and cannot represent the actual current profiles well. Moreover, the variance of the predicted RDT of the LS-EKF is much smaller than that of RS-EKF, as shown in Table IV. This is mainly because the prediction horizon of the LS-EKF is much smaller than that of the RS-EKF, which leads to smaller uncertainty accumulation.

The above analysis indicates that the LS-EKF not only reduces the computation cost, but also maintains high accuracy for SOC estimation and RDT prediction. With these advantages, LS-EKF provides a promising solution for deploying high-fidelity EMs of Li-ion batteries for real-time applications, even on hardware with limited computational resources.

V. Conclusion

This disclosure provides a novel LS-EKF that integrates a simplified first principle model of Li-ion batteries for SOC estimation and RDT prediction. The proposed method combines the high fidelity of the SFP model and low computation of LS. The accuracy of the SFP model is verified by experimental data under different discharge profiles. The proposed method is verified with a series of experiments and comparison studies. The results show that it is able to reduce the computation cost significantly without scarifying accuracy and, at the same time, maintain low uncertainty accumulation in long-term prediction. This provides a promising solution to real-time electrochemical model-based Li-ion battery applications to hardware with low computation ability.

Various modifications and variations of the described methods, pharmaceutical compositions, and kits of the disclosure will be apparent to those skilled in the art without departing from the scope and spirit of the disclosure. Although the disclosure has been described in connection with specific embodiments, it will be understood that it is capable of further modifications and that the disclosure as claimed should not be unduly limited to such specific embodiments. Indeed, various modifications of the described modes for carrying out the disclosure that are obvious to those skilled in the art are intended to be within the scope of the disclosure. This application is intended to cover any variations, uses, or adaptations of the disclosure following, in general, the principles of the disclosure and including such departures from the present disclosure come within known customary practice within the art to which the disclosure pertains and may be applied to the essential features herein before set forth.

What is claimed is:

1. A method for estimating battery life and controlling operation of a battery system comprising;

acquiring, from at least one battery that powers an electrical load, a terminal-voltage measurement and a current measurement via respective sensors coupled to the battery;

diagnosing a state of health in at least one battery via a state of health diagnostic algorithm via a battery-management-system (BMS) computer processor having software stored therein for executing the state of health diagnostic algorithm;

establishing at least one predefined Lebesgue state for the state of health and storing same in the BMS computer processor;

executing the state of health diagnostic algorithm when a measured state of health for the at least one battery reaches the at least one predefined Lebesgue state;

executing a state of health prognostic algorithm to estimate at least one distribution of operating time for the at least one battery at the predefined Lebesgue state;

estimating a state of charge for the at least one battery via a state of charge diagnostic algorithm via the BMS computer processor also having software stored therein for executing the state-of-charge diagnostic algorithm;

executing the state of charge diagnostic algorithm when the measured battery state of health for the at least one battery reaches the at least one predefined Lebesgue state wherein a state-of-charge measurement used for event checking is obtained by Coulomb counting of the acquired current over time and wherein the state of charge estimation is based on at least one previous predefined Lebesgue state; and executing a state of charge prognostic algorithm to estimate at least one distribution of operating time for each state of charge reaching each Lebesgue state wherein the state of charge diagnostic and the state of charge prognostic algorithm implement a simplified first-principles electrochemical model including open-circuit voltage determined from solid-phase surface concentrations, solid-phase diffusion, liquid-phase diffusion, reaction polarization, and ohmic polarization; and in response to the estimated distribution indicating that state of charge will cross an end-of-discharge Lebesgue state within a configured safety horizon, transmitting, from the BMS processor to a power-management module coupled to the battery, a control signal that causes one or more of: (i) reduction of a discharge-current limit, (ii) reduction of a charge-current limit, (iii) load shedding, or (iv) opening of a protective switch to prevent over-discharge.

2. The method for estimating battery life of claim 1, further comprising establishing multiple predefined Lebesgue states for the state of health and storing same in the BMS computer processor, each Lebesgue state corresponding to a fixed Lebesgue length in state-of-charge space.

3. The method for estimating battery life of claim 1, further comprising wherein the at least one previous predefined Lebesgue state is the predefined Lebesgue state occurring immediately prior to the at least one predefined first Lebesgue state that caused executing the state of charge diagnostic algorithm.

4. The method for estimating battery life of claim 1, further comprising adjusting an execution schedule of the state of charge diagnostic algorithm based on a rate of change from a first predefined Lebesgue state to a second predefined Lebesgue state, wherein adjusting the execution schedule reduces processor wake-up and computational load of the BMS processor relative to periodic execution.

5. The method for estimating battery life of claim 1, further comprising decreasing a frequency of executing the state of charge diagnostic algorithm when the rate of change from the first predefined Lebesgue state to the second predefined Lebesgue state increases.

6. The method for estimating battery life of claim 5, further comprising increasing a frequency of executing the state of charge diagnostic algorithm when the rate of change from the first predefined Lebesgue state to the second predefined Lebesgue state decreases.

7. The method for estimating battery life of claim 5, further comprising not executing any state-of-charge prognostic algorithm until the at least one predefined Lebesgue state is reached.

8. The method for estimating battery life of claim 5, further comprising conducting the estimation in real time on an embedded microcontroller of the BMS coupled to the battery.

9. A method for providing a state of charge estimation and remaining dischargeable time prediction for batteries comprising:

measuring, by sensors coupled to the battery, terminal voltage and current at a sampling rate;

implementing a Lebesgue Sampling based Extended Kalman Filter (LS-EKF) with respect to at least one battery via a BMS computer processor having software stored therein for executing the Lebesgue sampling based extended Kalman filter;

providing an event-triggered execution scheme wherein when a new state-of-charge measurement obtained by Coulomb counting of the measured current becomes available via a signal, an event checker determines whether the new measurement has transitioned from one Lebesgue state stored in the processor to another Lebesgue state stored in the processor;

executing, via the BMS computer processor, when the new measurement has transitioned from one Lebesgue state to another Lebesgue state, a state of charge algorithm to calculate a state of charge estimation by evaluating a simplified first-principles electrochemical model using the measured terminal voltage and current;

after obtaining the state of charge estimation, executing a remaining dischargeable time prediction algorithm via the BMS computer processor with a Lebesgue time model to predict an operation time distribution for the at least one battery; and issuing, when the predicted operation-time distribution indicates approach to an end-of-discharge Lebesgue state within a safety horizon, a control command to a power-management module to modify at least one of a discharge-current limit, a charge-current limit, or a load connection to prevent over-discharge.

10. The method for providing a state of charge estimation and remaining dischargeable time prediction for batteries of claim 9, further comprising determining an open circuit voltage via solid-phase surface concentration of particles at least one positive electrode and at least one negative electrode as part of the state-of-charge algorithm.

11. The method for providing a state of charge estimation and remaining dischargeable time prediction for batteries of claim 10, further comprising determining a liquid-phase diffusion effect via determining a concentration difference between the at least one positive electrode and the at least one negative electrode to determine the electrolyte overpotential.

12. The method for providing a state of charge estimation and remaining dischargeable time prediction for batteries of claim 9, further comprising wherein the processes estimates at least one internal electrochemical reaction comprising open-circuit voltage, solid-phase diffusion, liquid-phase diffusion, reaction polarization, and/or ohmic polarization.

13. The method for providing a state of charge estimation and remaining dischargeable time prediction for batteries of claim 9, further comprising conducting prediction of the operation time distribution in real time on an embedded microcontroller within the BMS computer processor.

14. The method for providing a state of charge estimation and remaining dischargeable time prediction for batteries of claim 9, further comprising wherein the LS-EKF is executed on the embedded BMS computer processor for state estimation as follows:

Step 1: Initialization $$x_{0|0} = E(x_0)$$

$$P_{0|0} = E\{[x_0 - E(x_0)][x_0 - E(x_0)]^T\}$$

where $x_{0|0}$ is an initial value of a SOC state; E(·) is an expectation; $P_{0|0}$ is an initial covariance matrix;

Step 2: An a priori state estimation $$x_{t_k|t_{k-1}} = f(x_{t_{k-1}}, u_{t_k}, D)$$

Step 3: A Covariance matrix calculation $$P_{t_k|t_k} = A_{t_k} P_{t_k^-} A_{t_k}^T + Q_{t_k|t_k}$$

where $H_{tk}$ is a Jacobian of a SOC process model f

Step 4: A Kalman gain Ktk is given as:

$$K_{t_k} = P_{t_k|t_k^-} H_{t_k}^T (H_{t_k} P_{t_k|t_k^-} H_{t_k}^T + R_{t_k})^{-1}$$

where Htk is a Jacobian of an observation model h;

Step 5: An a posteriori estimation:

$$x_{t_k|t_k} = x_{t_k|t_{k-1}} + K_{t_k} [y_{t_k} - h(x_{t_k|t_{k-1}}, u_k)]$$

Step 6: An error covariance update wherein the observation model uses the measured terminal voltage and the a priori model state relates the state-of-charge to Coulomb-counted current between events:

$$P_{t_k|t_k} = (I_m - H_{t_k} H_{t_k}) P_{t_k|t_k^-}$$

where $I_m$ is an identity matrix.

* * * * *